(12) United States Patent
Ogino et al.

(10) Patent No.: US 11,472,168 B2
(45) Date of Patent: Oct. 18, 2022

(54) LAMINATED BODY INCLUDING NOVOLAC RESIN AS PEELING LAYER

(71) Applicant: NISSAN CHEMICAL CORPORATION, Tokyo (JP)

(72) Inventors: Hiroshi Ogino, Toyama (JP); Hirokazu Nishimaki, Toyama (JP); Ryo Karasawa, Toyama (JP); Tetsuya Shinjo, Toyama (JP); Satoshi Kamibayashi, Toyama (JP); Shunsuke Moriya, Toyama (JP); Takahisa Okuno, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 57 days.

(21) Appl. No.: 16/761,089

(22) PCT Filed: Oct. 30, 2018

(86) PCT No.: PCT/JP2018/040342
§ 371 (c)(1),
(2) Date: May 1, 2020

(87) PCT Pub. No.: WO2019/088103
PCT Pub. Date: May 9, 2019

(65) Prior Publication Data
US 2020/0353735 A1    Nov. 12, 2020

(30) Foreign Application Priority Data
Nov. 1, 2017    (JP) .............................. JP2017-212007

(51) Int. Cl.
| | |
|---|---|
| B32B 27/38 | (2006.01) |
| C09J 7/38 | (2018.01) |
| B32B 7/023 | (2019.01) |
| B32B 7/06 | (2019.01) |
| B32B 7/12 | (2006.01) |
| B32B 27/16 | (2006.01) |
| C09J 183/04 | (2006.01) |
| H01L 21/304 | (2006.01) |
| H01L 21/683 | (2006.01) |

(52) U.S. Cl.
CPC .............. *B32B 27/38* (2013.01); *B32B 7/023* (2019.01); *B32B 7/06* (2013.01); *B32B 7/12* (2013.01); *B32B 27/16* (2013.01); *C09J 7/38* (2018.01); *C09J 183/04* (2013.01); *H01L 21/304* (2013.01); *H01L 21/6836* (2013.01); *B32B 2250/02* (2013.01); *B32B 2250/03* (2013.01); *B32B 2307/40* (2013.01); *B32B 2310/0831* (2013.01); *B32B 2315/08* (2013.01); *B32B 2363/00* (2013.01); *B32B 2457/14* (2013.01); *C09J 2483/00* (2013.01)

(58) Field of Classification Search
CPC ............ B32B 2250/02; B32B 2250/03; B32B 2307/40; B32B 2310/0831; B32B 2315/08; B32B 2363/00; B32B 2457/14; B32B 27/16; B32B 27/38; B32B 7/023; B32B 7/06; B32B 7/12; H01L 21/304; H01L 21/6835; H01L 21/6836; H01L 2221/68327; H01L 2221/6834; H01L 2221/68381; H01L 2221/68386; H01L 23/562; C09J 183/04; C09J 2483/00; C09J 7/38
See application file for complete search history.

(56) References Cited

U.S. PATENT DOCUMENTS

| | | | |
|---|---|---|---|
| 2010/0041211 A1* | 2/2010 | Noda | .................. H01L 21/6835 438/464 |
| 2014/0311680 A1* | 10/2014 | Kubo | ........................ B32B 7/06 428/522 |
| 2015/0296632 A1 | 10/2015 | Fujino et al. | |
| 2016/0017083 A1 | 1/2016 | Imada et al. | |
| 2017/0200628 A1* | 7/2017 | Kamibayashi | ...... B32B 38/0008 |
| 2020/0033623 A1* | 1/2020 | Kyosuna | .............. H04N 9/3102 |

FOREIGN PATENT DOCUMENTS

| | | |
|---|---|---|
| JP | 2004-064040 A | 2/2004 |
| JP | 2012-106486 A | 6/2012 |
| JP | 2014-103229 A | 6/2014 |
| JP | 2017-050322 A | 3/2017 |
| JP | 2017-069541 A | 4/2017 |

(Continued)

OTHER PUBLICATIONS

English translation of JP2017050322.*
English translation of JP2017069541.*
English translation of JP201403229.*
Jan. 29, 2019 International Search Report issued in International Patent Application No. PCT/JP2018/040342.
Jan. 29, 2019 Written Opinion of the International Searching Authority issued in International Patent Application No. PCT/JP2018/040342.
Jan. 17, 2022 Office Action issued in Taiwanese Patent Application No. 107138741.

(Continued)

*Primary Examiner* — Sonya M Sengupta
(74) *Attorney, Agent, or Firm* — Oliff PLC

(57) ABSTRACT

A laminated body for polishing a back surface of a wafer, the laminated body including an intermediate layer that is disposed between a support and a circuit surface of the wafer and peelably adheres to the support and the circuit surface, wherein the intermediate layer includes an adhesion layer in contact with the wafer and a peeling layer in contact with the support, and the peeling layer contains a novolac resin that absorbs light with a wavelength of 190 nm to 600 nm incident through the support, resulting in modification. The light transmittance of the peeling layer at a wavelength range of 190 nm to 600 nm may be 1 to 90%. The modification caused by absorption of light may be photo-decomposition of the novolac resin.

17 Claims, No Drawings

(56) References Cited

FOREIGN PATENT DOCUMENTS

| | | |
|---|---|---|
| TW | 201434887 A | 9/2014 |
| TW | 201543968 A | 11/2015 |
| WO | 2015/190438 A1 | 12/2015 |

OTHER PUBLICATIONS

Nov. 17, 2021 Extended Search Report issued in European Patent Application No. 18872695.4.
Jul. 6, 2022 Office Action issued in Japanese Patent Application No. 2019-550416.

\* cited by examiner

LAMINATED BODY INCLUDING NOVOLAC RESIN AS PEELING LAYER

TECHNICAL FIELD

The present invention relates to a laminated body for processing an object to be processed comprising an intermediate layer that is disposed between a support and the object to be processed and peelably adheres to the support and the object to be processed and a temporary adhesive for separating the intermediate layer by irradiation with ultraviolet light. In particular, the present invention relates to a temporary adhesive for fixing a wafer on a support while a back surface of the wafer is polished and a laminated body using the same.

BACKGROUND ART

For conventional semiconductor wafers that are two-dimensionally integrated in a plane direction, a semiconductor integration technology of integrating (laminating) planes of wafers in a three-dimensional direction for further integration is required. The three-dimensional lamination is a technology in which wafers are integrated into multiple layers with the wafers connected by a through silicon via (TSV). During integration into multiple layers, each wafer to be integrated is made thin by polishing a surface (i.e., back surface) opposite to a formed circuit surface, and the thinned semiconductor wafers are laminated.

Each semiconductor wafer before thinning (herein, also simply referred to as wafer) is allowed to adhere to a support for polishing by a polisher. In this case, the adhesion is referred to as temporary adhesion since easy peeling is needed after polishing. In this temporary adhesion, the wafer needs to be easily detached from the support. When a large force is applied for detachment, the thinned semiconductor wafer may be cut or deformed. In order to prevent cutting or deformation, easy detachment is required. However, detachment or shifting due to polishing stress when the back surface of the semiconductor wafer is polished is not preferred. Therefore, a performance required for temporary adhesion is resistance to stress in polishing and easy detachment after polishing.

For example, performances such as high stress in a plane direction in polishing (high adhesion force) and low stress in a longitudinal direction in detachment (low adhesion force) are required.

A method by laser irradiation for such adhesion and separation processes is disclosed (see Patent Documents 1 and 2).

However, when a temporary adhesive used for the adhesion and separation processes is irradiated with a laser, heat is generated, and a gas may be generated. As a result, a wafer is largely damaged.

PRIOR ART DOCUMENTS

Patent Documents

Patent Document 1: Japanese Unexamined Patent Application Publication No. 2004-64040 (JP 2004-64040 A)
Patent Document 2: Japanese Unexamined Patent Application Publication No. 2012-106486 (JP 2012-106486 A)

SUMMARY OF THE INVENTION

Problems to be Solved by the Invention

The present invention provides a laminated body for separating an object to be processed by cutting or the like, or for processing, for example, polishing a back surface of a wafer, the laminated body comprising an intermediate layer that is disposed between a support and the object to be processed and peelably adheres to the support and the object to be processed, wherein the intermediate layer includes at least a peeling layer in contact with the support, and the peeling layer contains a novolac resin that absorbs light with a wavelength of 190 nm to 400 nm or 190 nm to 600 nm incident through the support, resulting in modification, and a material and a method for separation without mechanical load.

Means for Solving the Problems

A first aspect of the present invention is a laminated body for processing an object to be processed, the laminated body comprising an intermediate layer that is disposed between a support and the object to be processed and peelably adheres to the support and the object to be processed, wherein the intermediate layer includes at least a peeling layer in contact with the support, and the peeling layer contains a novolac resin that absorbs light with a wavelength of 190 nm to 600 nm incident through the support, resulting in modification.

A second aspect of the present invention is a laminated body for cutting a plurality of chips with a redistribution layer that are fixed by a resin after peeling a support into a small number of chips, the laminated body comprising an intermediate layer that is disposed between the support and the redistribution layer having the chips fixed by the resin and peelably adheres to the support and the redistribution layer, wherein the intermediate layer includes at least a peeling layer in contact with the support, and the peeling layer contains a novolac resin that absorbs light with a wavelength of 190 nm to 600 nm incident through the support, resulting in modification.

A third aspect of the present invention is a laminated body for polishing a back surface of a wafer, comprising an intermediate layer that is disposed between a support and a circuit surface of the wafer and peelably adheres to the support and the circuit surface, wherein the intermediate layer includes an adhesion layer in contact with the wafer and a peeling layer in contact with the support, and the peeling layer contains a novolac resin that absorbs light with a wavelength of 190 nm to 600 nm incident through the support, resulting in modification.

A fourth aspect of the present invention is the laminated body according to any one of the first to third aspects, wherein the light transmittance of the peeling layer at a wavelength range of 190 nm to 600 nm is 1 to 90%.

A fifth aspect of the present invention is the laminated body according to any one of the first to fourth aspects, wherein the modification caused by absorption of light having the wavelength is photodecomposition of the novolac resin.

A sixth aspect of the present invention is the laminated body according to any one of the third to fifth aspects, wherein the intermediate layer includes the adhesion layer containing a component (A) to be cured by a hydrosilylation reaction and a component (B) containing a polydimethylsiloxane.

A seventh aspect of the present invention is the laminated body according to the sixth aspect, wherein the component (A) contains a polysiloxane selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, and a siloxane unit (T unit) of $R^6SiO_{3/2}$ (provided that $R^1$ to $R^6$ each are bonded to a silicon atom through an Si—C bond or an Si—H bond), and contains a polysiloxane (A1) containing a polyorganosiloxane (a1) in which monovalent chemical groups of $R^1$ to $R^6$ each contain a $C_{1-10}$ alkyl group and a $C_{2-10}$ alkenyl group, and a polyorganosiloxane (a2) in which the monovalent chemical groups of $R^1$ to $R^6$ each contain a $C_{1-10}$ alkyl group and a hydrogen atom, and a platinum group metal-based catalyst (A2).

An eighth aspect of the present invention is the laminated body according to the sixth or seventh aspect, wherein the component (A) further contains an inhibitor (A3).

A ninth aspect of the present invention is the laminated body according to any one of the sixth to eighth aspects, wherein the component (B) is a polydimethylsiloxane having a viscosity of 1,000 $mm^2/s$ to 2,000,000 $mm^2/s$.

A tenth aspect of the present invention is the laminated body according to any one of the sixth to eighth aspects, wherein the component (B) is a polydimethylsiloxane having a viscosity of 10,000 $mm^2/s$ to 1,000,000 $mm^2/s$.

An eleventh aspect of the present invention is the laminated body according to any one of the sixth to tenth aspects, wherein the ratio in % by mass of the component (A) to the component (B) in an adhesive is 80:20 to 50:50.

A twelfth aspect of the present invention is the laminated body according to any one of the first to eleventh aspects, wherein the peeling layer contains a polymer (C) having the following unit structure (C1-1), (C1-2), or (C1-3), or a combination thereof

Formula (C1-1)

Formula (C1-2)

Formula (C1-3)

(wherein (C1) is a group derived from an aromatic compound having a nitrogen atom, (C2) is a group forming a secondary carbon atom, a quaternary carbon atom, or a tertiary carbon atom having an aromatic ring in a side chain, (C3) is a group derived from an aliphatic polycyclic compound, and (C4) is a group derived from phenol, bisphenol, naphthol, biphenyl, biphenol, or a combination thereof).

A thirteenth aspect of the present invention is the laminated body according to the twelfth aspect, wherein the group (C1) derived from an aromatic compound having a nitrogen atom is a group derived from carbazole or phenylnaphthylamine.

A fourteenth aspect of the present invention is the laminated body according to the twelfth or thirteenth aspect, wherein the group (C2) is a group derived from 1-naphthaldehyde, 1-pyrenecarboxyaldehyde, or 4-(trifluoromethyl)benzaldehyde, and the group (C3) is a group derived from dicyclopentadiene.

A fifteenth aspect of the present invention is a method for producing the laminated body according to any one of the third to fifth aspects including steps of: applying an adhesive for forming the adhesion layer according to any one of the sixth to eleventh aspects to the circuit surface of the wafer to form the adhesion layer; applying a peeling layer-forming composition for forming the peeling layer according to any one of the twelfth to fourteenth aspects to the support to form the peeling layer; and bonding the wafer and the support so that the adhesion layer is in contact with the peeling layer followed by heating at 120° C. to 300° C. to achieve joining.

A sixteenth aspect of the present invention is the method for producing the laminated body according to the fifteenth aspect, wherein the bonding is carried out under a reduced pressure of 10 Pa to 10,000 Pa.

A seventeenth aspect of the present invention is a method for peeling the support and the object to be processed according to any one of the first to fifth aspects, wherein the support is a glass substrate, and irradiation with light with a wavelength of 190 nm to 600 nm is carried out from a side of the support.

An eighteenth aspect of the present invention is a removing method, wherein the object to be processed according to the seventeenth aspect is a wafer, and the adhesion layer or the peeling layer is removed from the support or the wafer using a tape after peeling the support and the wafer.

Effects of the Invention

According to the present invention, when the intermediate layer that is disposed between the support and the object to be processed and includes the peeling layer is irradiated with an ultraviolet laser, the peeling layer is modified (photodecomposed) to separate the support and the object to be processed.

Specifically, the laminated body is one for processing an object to be processed comprising an intermediate layer that is disposed between a support and the object to be processed and peelably adheres to the support and the object to be processed, wherein the intermediate layer includes at least a peeling layer in contact with the support, and the peeling layer contains a novolac resin that absorbs light with a wavelength of 190 nm to 400 nm or 190 nm to 600 nm incident through the support, resulting in modification.

More specifically, the laminated body may be used in a step in which a redistribution layer (RDL) is formed on a peeling layer on a support (glass substrate), a plurality of chips are connected to the redistribution layer and fixed (molded) by a resin or the like, the peeling layer is irradiated with an ultraviolet laser from a side of the support, resulting in photodecomposition, the chips fixed by the resin and the support are separated, and the plurality of chips fixed by the resin are then cut with the resin into several chips or a single chip.

That is, the present invention relates to a laminated body for cutting a plurality of chips into a small number of chips, the laminated body comprising an intermediate layer that is disposed between a support and the plurality of chips with a redistribution layer that are fixed by the resin, and peelably adheres to the support and the plurality of chips, wherein the intermediate layer includes at least a peeling layer in contact with the support, and the peeling layer contains a novolac resin that absorbs light with a wavelength of 190 nm to 400 nm or 190 nm to 600 nm incident through the support, resulting in modification. The intermediate layer includes at least the peeling layer in contact with the support, and may further include another layer. When the intermediate layer includes only the peeling layer and does not include other layers, the peeling layer is in contact with the support and an object to be processed.

The present invention can be used in polishing a back surface of a wafer for a reduction in thickness of the wafer for three-dimensional mounting.

The present invention is a laminated body for processing a back surface of a wafer, comprising an intermediate layer that is disposed between a support and a circuit surface of the wafer and peelably adheres to the support and the circuit surface, wherein the intermediate layer includes an adhesion layer in contact with the wafer and a peeling layer in contact with the support.

The adhesion layer contains a component (A) to be crosslinked and cured by a hydrosilylation reaction, and a component (B) containing a non-crosslinking polydimethylsiloxane, and the peeling layer contains a novolac resin (C) that absorbs light with a wavelength of 190 nm to 400 nm or 190 nm to 600 nm incident through the support, resulting in modification. The novolac resin is modified by ultraviolet light incident through the support. This modification is considered to be decomposition of the novolac resin by ultraviolet light. Due to decomposition of the novolac resin, the peeling layer is separated at an interface between the peeling layer and the adhesion layer, an interface between the peeling layer and the support, or an inside of the peeling layer. In the present invention, during separation of the wafer from the support after processing the back surface of the wafer, the wafer can be easily separated by laser irradiation with ultraviolet light with a wavelength of 190 nm to 400 nm or 190 nm to 600 nm. Therefore, even when mechanical stress is applied to the wafer, damage such as warping and deformation of the wafer is not caused.

Further, the adhesion layer containing the components (A) and (B) that still remains on the circuit surface of the wafer after processing (polishing) the back surface of the wafer and then peeling the wafer and the support can be easily removed using a tape or the like. This is because the component (B) has a peeling action against the wafer.

MODES FOR CARRYING OUT THE INVENTION

The present invention is a laminated body for processing a back surface of a wafer, the laminated body comprising an intermediate layer that is disposed between a support and a circuit surface of the wafer and peelably adheres to the support and the circuit surface, wherein the intermediate layer includes an adhesion layer in contact with the wafer and a peeling layer in contact with the support, and the peeling layer contains a novolac resin that absorbs light with a wavelength of 190 nm to 400 nm or 190 nm to 600 nm incident through the support, resulting in modification.

The light transmittance of the peeling layer at a wavelength range of 190 nm to 400 nm or 190 nm to 600 nm may be 1 to 85% or 1 to 90%.

In the present invention, the adhesion layer is formed from an adhesive. The adhesive contains components (A) and (B), and may further contain another additive.

The component (A) contains a polysiloxane (A1) that contains a polysiloxane selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, and a siloxane unit (T unit) of $R^6SiO_{3/2}$ (provided that $R^1$ to $R^6$ each are bonded to a silicon atom through an Si—C bond or an Si—H bond), and contains a polyorganosiloxane (a1) in which monovalent chemical groups of $R^1$ to $R^6$ each contain a $C_{1-10}$ alkyl group and a $C_{2-10}$ alkenyl group, and a polyorganosiloxane (a2) in which the monovalent chemical groups of $R^1$ to $R^6$ each contain a $C_{1-10}$ alkyl group and a hydrogen atom, and a platinum group metal-based catalyst (A2).

The polysiloxane (A1) contains the polyorganosiloxanes (a1) and (a2). The polyorganosiloxane (a1) contains a $C_{1-10}$ alkyl group and a $C_{2-10}$ alkenyl group. The polyorganosiloxane (a2) contains a $C_{1-10}$ alkyl group and a hydrogen atom. By a hydrosilylation reaction of an alkenyl group with an Si—H group using the platinum group metal-based catalyst (A2), a crosslinking structure is formed and cured.

The polyorganosiloxane (a1) is selected from the Q unit, the M unit, the D unit, and the T unit, and can be formed, for example, from a combination of (the Q unit and the M unit) and (the D unit and the M unit), a combination of (the T unit and the M unit) and (the D unit and the M unit), a combination of (the Q unit, the T unit, and the M unit) and (the T unit and the M unit), a combination of (the T unit and the M unit), or a combination of (the Q unit and the M unit).

The polyorganosiloxane (a2) is selected from the Q unit, the M unit, the D unit, and the T unit, and can be formed, for example, from a combination of (the M unit and the D unit), a combination of (the Q unit and the M unit), or a combination of (the Q unit, the T unit, and the M unit).

Examples of the $C_{2-10}$ alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dipentenylmethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, and 1-i-propyl-2-propenyl group. In particular, ethenyl group, that is, vinyl group, or 2-propenyl group, that is, allyl group can be preferably used.

Examples of the $C_{1-10}$ alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group. In particular, methyl group can be preferably used.

The polyorganosiloxane (a1) includes a $C_{1-10}$ alkyl group and a $C_{2-10}$ alkenyl group, the $C_{1-10}$ alkyl group is methyl group, and the $C_{2-10}$ alkenyl group is ethenyl group, that is, vinyl group. In all substituents of $R^1$ to $R^6$, 0.1% by mole to 50.0% by mole, and preferably 0.5% by mole to 30.0% by mole is constituted by the alkenyl group, and the remaining is the alkyl group.

The polyorganosiloxane (a2) includes a $C_{1-10}$ alkyl group and a hydrogen atom, the $C_{1-10}$ alkyl group is methyl group, and the hydrogen atom forms an Si—H structure. In all substituents of $R^1$ to $R^6$, 0.1% by mole to 50.0% by mole, and preferably 10.0% by mole to 40.0% by mole is constituted by the hydrogen atom, that is, the Si—H group, and the remaining is the alkyl group.

In the polyorganosiloxanes (a1) and (a2), the molar ratio of the alkenyl group to the hydrogen atom in the Si—H group may fall within a range of 2.0:1.0, and preferably 1.5:1.0.

The weight average molecular weights of the polyorganosiloxanes (a1) and (a2) to be used may fall within a range of 500 to 1,000,000 and 5,000 to 50,000, respectively. The viscosities of the polyorganosiloxanes (a1) and (a2) to be used may fall within a range of 10 mPa·s to 1,000,000 mPa·s, 10 mPa·s to 100,000 mPa·s, or 10 mPa·s to 10,000 mPa·s. The viscosities can be determined by measurement at 25° C. with an E-type rotary viscometer.

The component (A) contains the platinum group metal-based catalyst (A2). The platinum group metal-based catalyst is a catalyst for promoting a hydrosilylation addition reaction of the alkenyl group with the Si—H group. The platinum group metal-based catalyst such as platinum black, platinum chloride, chloroplatinic acid, a reaction product of chloroplatinic acid with a monovalent alcohol, a complex of chloroplatinic acid with an olefin, or platinum bisacetoacetate is used. Examples of the complex of platinum with an olefin include a complex of divinyltetramethyldisiloxane with platinum. The amount of the platinum catalyst to be added may fall within a range of 1.0 to 500.0 ppm or 1.0 to 50.0 ppm relative to the total amount of the polyorganosiloxanes (a1) and (a2) in terms of platinum metal.

An alkynyl alcohol as an inhibitor (A3) for inhibiting the advance of the hydrosilylation reaction may be further added to the component (A). Examples of the inhibitor include 1-ethynyl-1-cyclohexanol. The inhibitor may be added in an amount falling within a range of 500.0 to 100,000.0 ppm or 1,000.0 to 10,000.0 ppm relative to the total amount of the polyorganosiloxanes (a1) and (a2).

A polyorganosiloxane used in the component (B) of the present invention contains a siloxane unit of $RRSiO_{2/2}$ (D unit) (provided that each R is bonded to a silicon atom through an Si—C bond), wherein R is a $C_{1-10}$ alkyl group, which may be exemplified by examples described above. The $C_{1-10}$ alkyl group is preferably a methyl group, and the polyorganosiloxane may be preferably a polydimethylsiloxane.

A polysiloxane used in the component (B) contains the siloxane unit (D unit), and may contain the Q unit, the M unit, and the T unit. For example, the polysiloxane may contain only the D unit, a combination of the D unit and the Q unit, a combination of the D unit and the M unit, a combination of the D unit and the T unit, a combination of the D unit, the Q unit, and the M unit, a combination of the D unit, the M unit, and the T unit, a combination of the D unit, the Q unit, the M unit, and the T unit, or the like.

The component (B) may be a polydimethylsiloxane having a viscosity of 1,000 mm²/s to 2,000,000 mm²/s.

The component (B) may be a polydimethylsiloxane having a viscosity of 10,000 mm²/s to 1,000,000 mm²/s. The component (B) is a dimethylsilicone oil made of a polydimethylsiloxane. The viscosity is represented by kinematic viscosity in centistoke (cSt)=mm²/s. The kinematic viscosity can be measured by a kinematic viscometer. Alternatively, the kinematic viscosity can be determined by dividing the viscosity (mPa·s) by the density (g/cm³). That is, the kinematic viscosity can be determined from the viscosity and density measured at 25° C. with an E-type rotary viscometer. The kinematic viscosity can be calculated by kinematic viscosity (mm²/s)=viscosity (mPa·s)/density (g/cm³).

In the adhesive of the present invention, the ratio of the component (A) to the component (B) may be any ratio.

In terms of adhesion, the ratio of the component (A) to the component (B) in the adhesive may be any ratio. In order to achieve good peeling properties, the ratio in % by mass of the component (A) to the component (B) in the adhesive may be 80:20 to 20:80. When a peeling surface is controlled, it is preferable that the ratio in % by mass of the component (A) to the component (B) in the adhesive be 80:20 to 50:50.

The peeling layer may be formed from a novolac resin that absorbs light with a wavelength of 190 nm to 400 nm or 190 nm to 600 nm incident through the support, resulting in modification.

The peeling layer is formed by applying a peeling layer-forming composition, followed by drying and curing.

The peeling layer-forming composition contains a polymer (C) and a solvent. The peeling layer-forming composition may further contain a crosslinker, an acid catalyst, and a surfactant.

The solid content of this composition is 0.1 to 70% by mass or 0.1 to 60% by mass. The solid content is a content of all components of the peeling layer-forming composition except for the solvent. The solid content may contain the polymer in an amount of 1 to 100% by mass, 1 to 99.9% by mass, or 50 to 99.9% by mass.

The polymer used in the present invention has a weight average molecular weight of 600 to 1,000,000 or 600 to 200,000.

The peeling layer contains the polymer (C) having a unit structure (C1-1), (C1-2), or (C1-3), or a combination thereof.

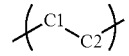

Formula (C1-1)

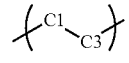

Formula (C1-2)

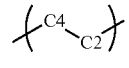

Formula (C1-3)

In Formulae above, (C1) is a group derived from an aromatic compound having a nitrogen atom, (C2) is a group forming a secondary carbon atom, a quaternary carbon atom, or a tertiary carbon atom having an aromatic ring in a side chain, (C3) is a group derived from an aliphatic polycyclic compound, and (C4) is a group derived from phenol, bisphenol, naphthol, biphenyl, biphenol, or a combination thereof.

Specifically, the peeling layer may contain the polymer (C) containing a unit structure having a bond between (C1) the aromatic compound having a nitrogen atom and (C2) the secondary carbon atom, the quaternary carbon atom, or the tertiary carbon atom having an aromatic ring in a side chain, a unit structure having a bond between (C1) the aromatic compound having a nitrogen atom and (C3) the aliphatic polycyclic compound, a unit structure having a bond between (C4) phenol, bisphenol, naphthol, biphenyl, biphenol, or a compound having structures thereof and (C2) the secondary carbon atom, the quaternary carbon atom, or the tertiary carbon atom having an aromatic ring in a side chain, or a combination of the unit structures.

The peeling layer may contain the polymer (C) containing a unit structure having a bond between (C1) the aromatic compound having a nitrogen atom and (C2) the tertiary carbon atom having an aromatic ring in a side chain, or a unit structure having a bond between (C1) the aromatic compound having a nitrogen atom and (C3) the aliphatic polycyclic compound.

The aromatic compound having a nitrogen atom (C1) for formation of the peeling layer may be derived from carbazole or phenylnaphthylamine.

The group (C2) for formation of the peeling layer may be derived from 1-naphthaldehyde, 1-pyrenecarboxyaldehyde, 4-(trifluoromethyl)benzaldehyde, or acetaldehyde, and (C3) may be derived from dicyclopentadiene.

The group (C4) for formation of the peeling layer may be derived from phenol, bisphenol, naphthol, biphenyl, or biphenol.

Examples of the unit structure of the following Formula (C1-1) of the polymer (C) include as follows.

Formula (C1-1)

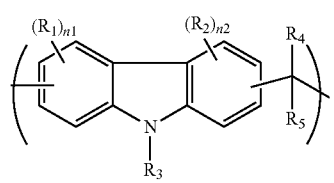

In Formula (C1-1), $R_1$ and $R_2$ are each a hydrogen atom, a halogen group, a nitro group, an amino group, a hydroxy group, a $C_{1-10}$ alkyl group, a $C_{2-10}$ alkenyl group, a $C_{6-40}$ aryl group, or a combination thereof that may include an ether bond, a ketone bond, or an ester bond. $R_3$ is a hydrogen atom, a $C_{1-10}$ alkyl group, a $C_{2-10}$ alkenyl group, a $C_{6-40}$ aryl group, or a combination thereof that may include an ether bond, a ketone bond, or an ester bond. $R_4$ is a hydrogen atom or a $C_{6-40}$ aryl group optionally substituted with a halogen group, a nitro group, an amino group, or a hydroxy group, and $R_5$ is a hydrogen atom or a $C_{1-10}$ alkyl or $C_{6-40}$ aryl group optionally substituted with a halogen group, a nitro group, an amino group, or a hydroxy group. n1 and n2 are each an integer of 1 to 3.

Examples of the alkyl group and the alkenyl group include those exemplified above.

Examples of the $C_{6-40}$ aryl group include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

Specific examples of the unit structure of Formula (C1-1-1) include as follows.

Formula (C1-1-1-1)

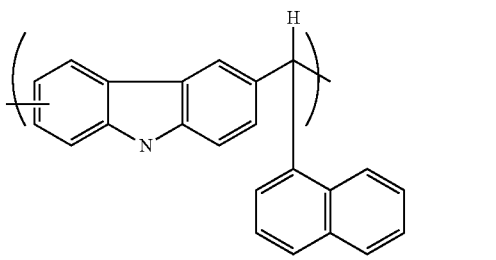

Formula (C1-1-1-2)

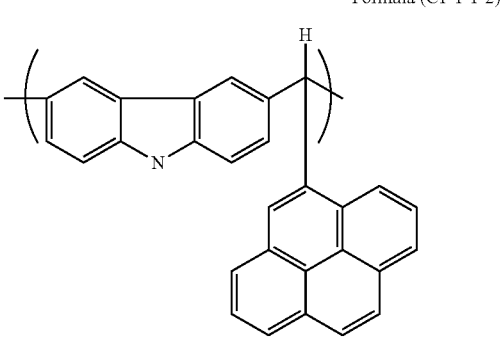

Formula (C1-1-1-3)

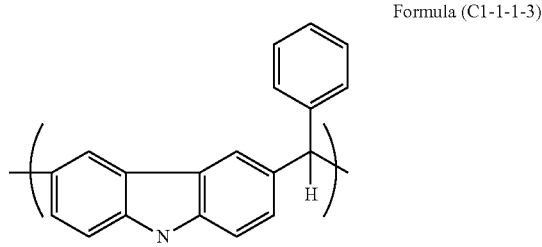

Formula (C1-1-1-4)

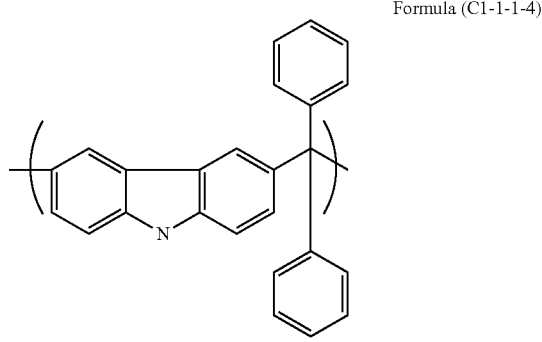

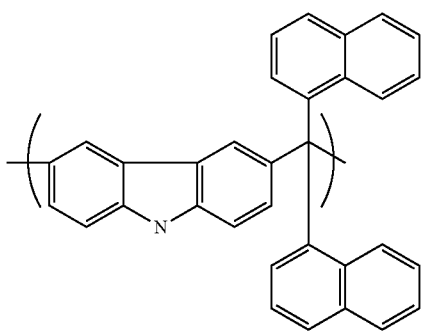

Formula (C1-1-1-5)

Examples of the unit structure of the following Formula (C1-1) of the polymer (C) include as follows.

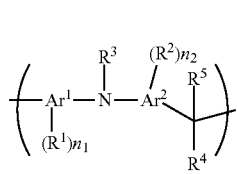

Formula (C1-1-2)

In Formula (C1-1-2), $Ar^1$ and $Ar^2$ are each a benzene ring or a naphthalene ring, $R^1$ and $R^2$ are each a substituent of a hydrogen atom and are each selected from the group consisting of a halogen group, a nitro group, an amino group, a hydroxy group, a $C_{1-10}$ alkyl group, a $C_{2-10}$ alkenyl group, a $C_{6-40}$ aryl group, and a combination thereof, and the alkyl group, the alkenyl group, and the aryl group are an organic group optionally having an ether bond, a ketone bond, or an ester bond.

$R^3$ is selected from the group consisting of a hydrogen atom, a $C_{1-10}$ alkyl group, a $C_{2-10}$ alkenyl group, a $C_{6-40}$ aryl group, and a combination thereof, and the alkyl group, the alkenyl group, and the aryl group are an organic group optionally having an ether bond, a ketone bond, or an ester bond.

$R^4$ is selected from the group consisting of a $C_{6-40}$ aryl group and a heterocyclic group, and the aryl group and the heterocyclic group are an organic group optionally substituted with a halogen group, a nitro group, an amino group, a $C_{1-10}$ alkyl group, a $C_{1-10}$ alkoxy group, a $C_{6-40}$ aryl group, a formyl group, a carboxyl group, or a hydroxy group.

$R^5$ is selected from the group consisting of a hydrogen atom, a $C_{1-10}$ alkyl group, a $C_{6-40}$ aryl group, and a heterocyclic group, the alkyl group, the aryl group, and the heterocyclic group are an organic group optionally substituted with a halogen group, a nitro group, an amino group, or a hydroxy group, and $R^4$ and $R^5$ may form a ring together. n1 and n2 are each an integer of 1 to 3.

Examples of the alkyl group, the alkenyl group, the aryl group and the like include those exemplified above.

Specific examples of the unit structure of Formula (C1-1-2) include as follows.

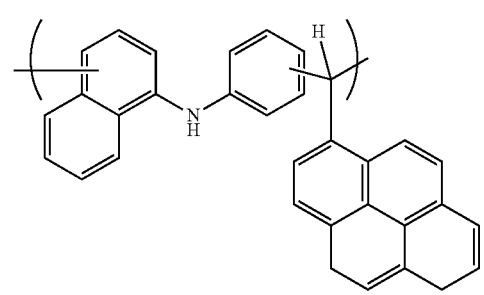

Formula (C1-1-2-1)

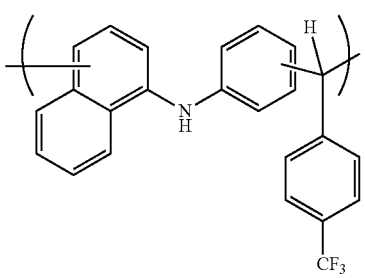

Formula (C1-1-2-2)

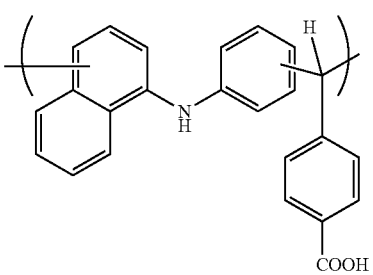

Formula (C1-1-2-3)

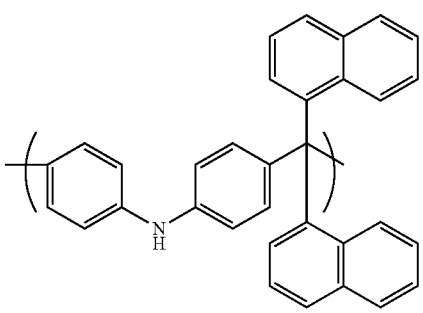

Formula (C1-1-2-4)

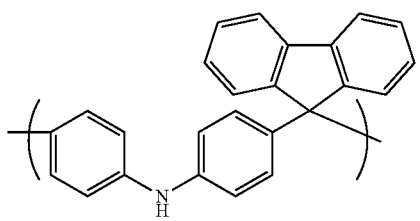

Formula (C1-1-2-5)

Examples of the unit structure of the following Formula (C1-2) of the polymer (C) include as follows.

Formula (C1-2-1)

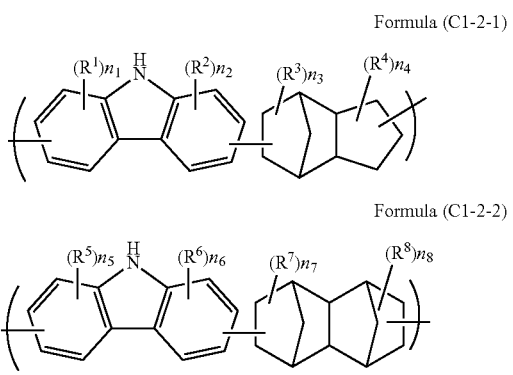

Formula (C1-2-2)

In Formulae above, $R^1$ to $R^8$ are a substituent of a hydrogen atom and are each a halogen group, a nitro group, an amino group, a hydroxy group, a $C_{1-10}$ alkyl group optionally substituted with a halogen group, a nitro group, an amino group, or a hydroxy group, or a $C_{6-40}$ aryl group optionally substituted with a halogen group, a nitro group, an amino group, or a hydroxy group, n1, n2, n5, and n6 are each an integer of 0 to 3, and n3, n4, n7, and n8 are each an integer of 0 to 4.

Specific examples thereof include as follows.

Formula (C1-2-1-1)

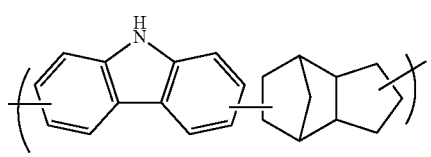

Formula (C1-2-2-1)

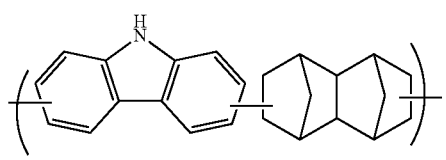

Examples of the unit structure of the following Formula (C1-3) of the polymer (C) include as follows.

Formula (C1-3-1-1)

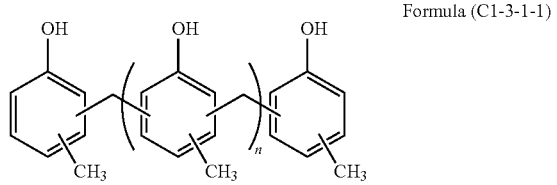

Formula (C1-3-1-2)

Formula (C1-3-1-3)

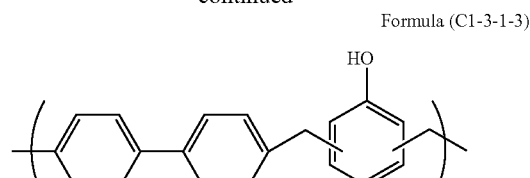

Formula (C1-3-1-4)

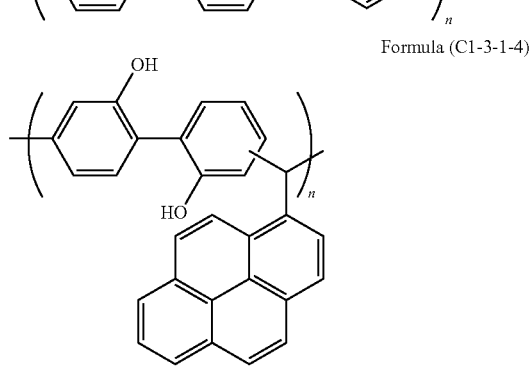

Formula (C1-3-1-5)

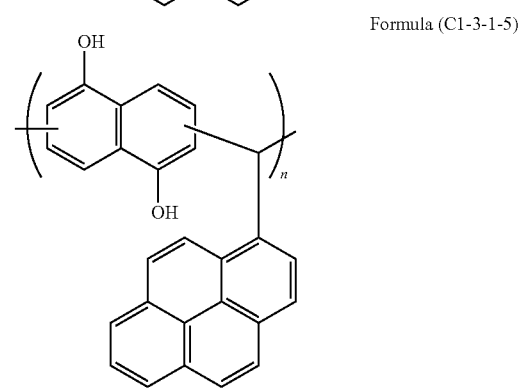

Examples of carbazole used in the present invention include carbazole, 1,3,6,8-tetranitrocarbazole, 3,6-diaminocarbazole, 3,6-dibromo-9-ethylcarbazole, 3,6-dibromo-9-phenylcarbazole, 3,6-dibromocarbazole, 3,6-dichlorocarbazole, 3-amino-9-ethylcarbazole, 3-bromo-9-ethylcarbazole, 4,4-bis(9H-carbazol-9-yl)biphenyl, 4-glycidylcarbazole, 4-hydroxycarbazole, 9-(1H-benzotriazol-1-ylmethyl)-9H-carbazole, 9-acetyl-3,6-diiodocarbazole, 9-benzoylcarbazole, 9-benzoylcarbazole-6-dicarboxyaldehyde, 9-benzylcarbazole-3-carboxyaldehyde, 9-methylcarbazole, 9-phenylcarbazole, 9-vinylcarbazole, carbazole potassium, carbazole-N-carbonyl chloride, N-ethylcarbazole-3-carboxaldehyde, and N-((9-ethylcarbazol-3-yl)methylene)-2-methyl-1-indolinylamine. The carbazole may be used alone, or two or more types thereof may be used in combination.

Examples of aldehyde used in production of the polymer of the present invention include saturated aliphatic aldehydes such as formaldehyde, paraformaldehyde, acetaldehyde, propylaldehyde, butyraldehyde, isobutyraldehyde, valeraldehyde, capronaldehyde, 2-methylbutyraldehyde, hexylaldehyde, undecanealdehyde, 7-methoxy-3,7-dimethyloctylaldehyde, cyclohexanealdehyde, 3-methyl-2-butyraldehyde, glyoxal, malonaldehyde, succinaldehyde, glutaraldehyde, and adipalaldehyde, unsaturated aliphatic aldehydes such as acrolein and methacrolein, heterocyclic aldehydes such as furfural, and pyridinealdehyde, and aromatic aldehydes such as benzaldehyde, naphthylaldehyde, anthrylaldehyde, phenanthrylaldehyde, salicylaldehyde, phenylacetaldehyde, 3-phenylpropionaldehyde, tolylaldehyde, (N,N-dimethylamino)benzaldehyde, and acetoxybenzaldehyde. In particular, an aromatic aldehyde may be preferably used.

A ketone used in production of the polymer of the present invention is a diaryl ketone, and examples thereof include diphenyl ketone, phenyl naphthyl ketone, dinaphtyl ketone, phenyl tolyl ketone, and ditolyl ketone.

The polymer used in the present invention is a novolac resin obtained by condensation of carbazole with an aldehyde or a ketone. In the condensation reaction, an aldehyde or a ketone can be used in an amount of 0.1 to 10 equivalent weights relative to 1 equivalent weight of the phenyl group of carbazole.

As an acid catalyst used in the condensation reaction, for example, a mineral acid such as sulfuric acid, phosphoric acid, or perchloric acid, an organic sulfonic acid such as p-toluene sulfonic acid or para-toluenesulfonic acid monohydrate, or a carboxylic acid such as formic acid or oxalic acid is used. The amount of the acid catalyst to be used is variously selected depending on the type of used acid. The amount is usually 0.001 to 10,000 parts by mass, preferably 0.01 to 1,000 parts by mass, and more preferably 0.1 to 100 parts by mass, relative to 100 parts by mass of carbazole or 100 parts by mass of total of carbazole and triphenylamine.

The condensation reaction is carried out without a solvent, but the concentration reaction is usually carried out using a solvent. Any solvent may be used as long as it does not inhibit the reaction. Examples thereof include cyclic ethers such as tetrahydrofuran and dioxane. When the used acid catalyst is, for example, a liquid like formic acid, it can also act as a solvent.

The reaction temperature during condensation is usually 40° C. to 200° C. The reaction time is variously selected depending on the reaction temperature, and is usually about 30 minutes to about 50 hours.

The weight average molecular weight Mw of the polymer obtained as described above is usually 600 to 1,000,000 or 600 to 200,000.

The polymer can be mixed with another polymer in an amount of 30% by mass or less relative to the total amount of the polymers and used.

Examples of the other polymer include a polyacrylate compound, a polymethacrylate compound, a polyacrylamide compound, a polymethacrylamide compound, a polyvinyl compound, a polystyrene compound, a polymaleimide compound, a polymaleic acid anhydride, and a polyacrylonitrile compound.

The composition may contain a crosslinker component. Examples of the crosslinker include a melamine-based crosslinker, a substituted urea-based crosslinker, and polymers thereof. The crosslinker is preferably a crosslinker having at least two crosslinking-forming substituents. Examples thereof include compounds including methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and butoxymethylated thiourea. A condensate of the compounds may also be used.

As the crosslinker, a crosslinker having high heat resistance can be used. As the crosslinker having high heat resistance, a compound containing a crosslinking-forming substituent having an aromatic ring (e.g., a benzene ring or a naphthalene ring) in the molecule may be preferably used.

Examples of the compound include a compound having a partial structure of Formula (4) below, and a polymer and an oligomer having a repeating unit of Formula (5) below.

In Formula (4), $R_9$ and $R_{10}$ are each a hydrogen atom, a $C_{1-10}$ alkyl group, or a $C_{6-20}$ aryl group, n6 is an integer of 1 to 4, n7 is an integer of 1 to (5−n6), and (n6+n7) is an integer of 2 to 5.

In Formula (5), $R_{11}$ is a hydrogen atom or a $C_{1-10}$ alkyl group, $R_{12}$ is a $C_{1-10}$ alkyl group, n8 is an integer of 1 to 4, n9 is an integer of 0 to (4−n8), and (n8+n9) is an integer of 1 to 4. The oligomer or polymer having 2 to 100 or 2 to 50 repeating unit structures may be used.

The alkyl group and the aryl group can be exemplified by the above-described alkyl groups and aryl groups.

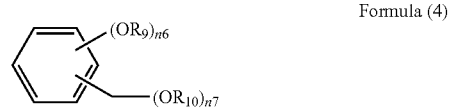

Formula (4)

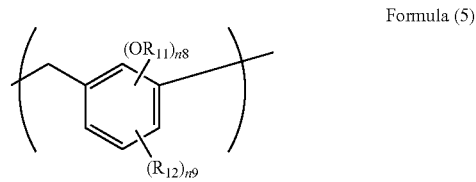

Formula (5)

Examples of the compound of Formula (4) and the polymer and the oligomer of Formula (5) include as follows.

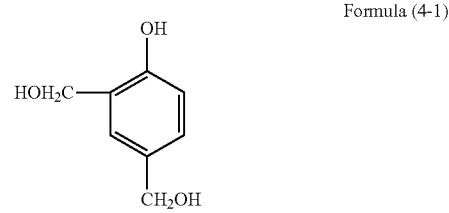

Formula (4-1)

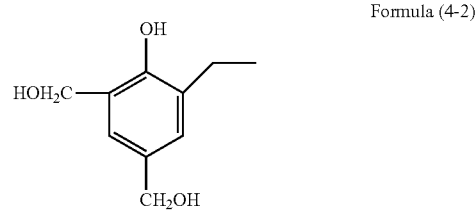

Formula (4-2)

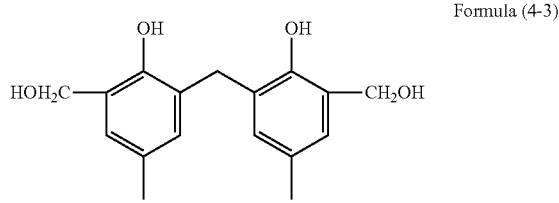

Formula (4-3)

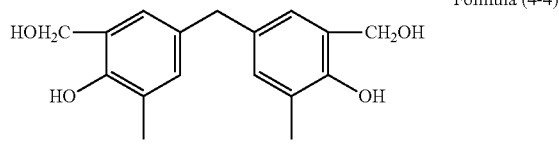

Formula (4-4)

Formula (4-5)
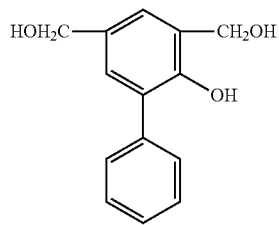
Formula (4-6)
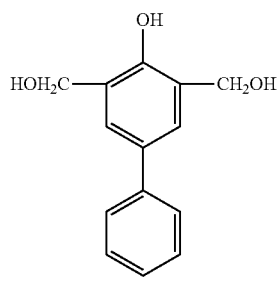
Formula (4-7)
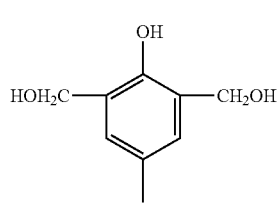
Formula (4-8)
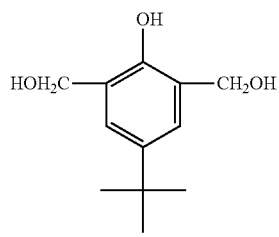
Formula (4-9)
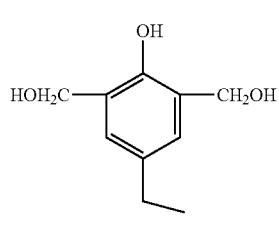
Formula (4-10)
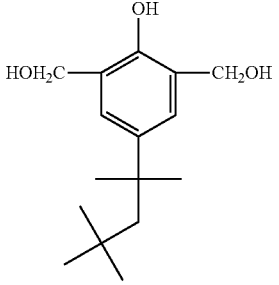
Formula (4-11)
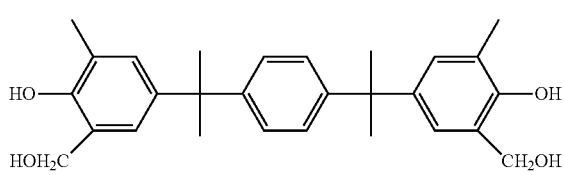
Formula (4-12)
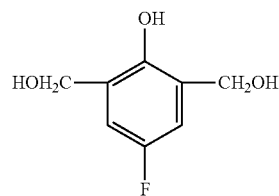
Formula (4-13)
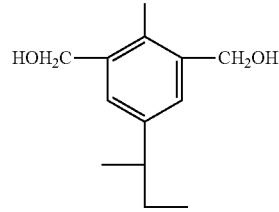
Formula (4-14)
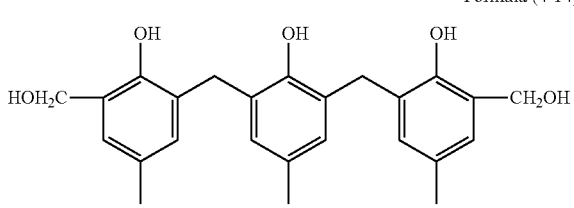
Formula (4-15)
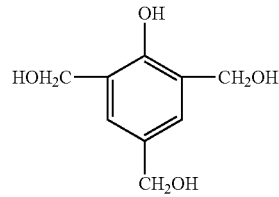
Formula (4-16)
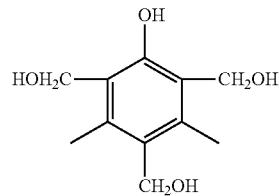
Formula (4-17)
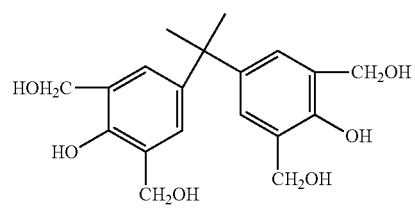
Formula (4-18)
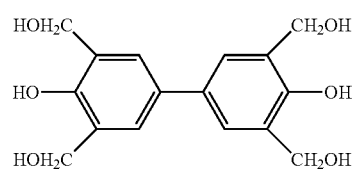

-continued

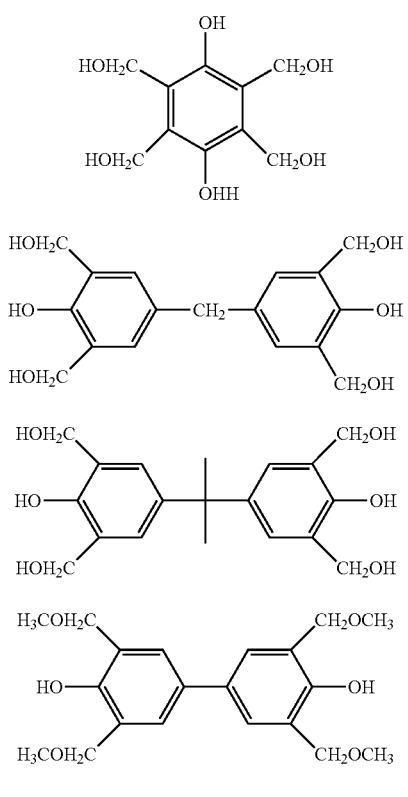

Formula (4-19)

Formula (4-20)

Formula (4-21)

Formula (4-22)

Formula (4-23)

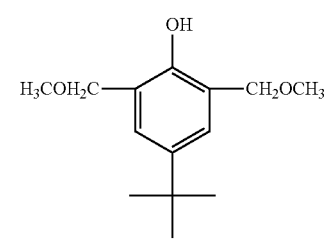

Formula (4-24)

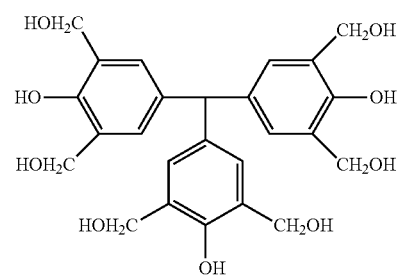

Formula (4-25)

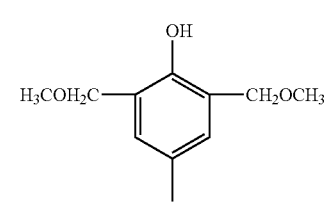

-continued

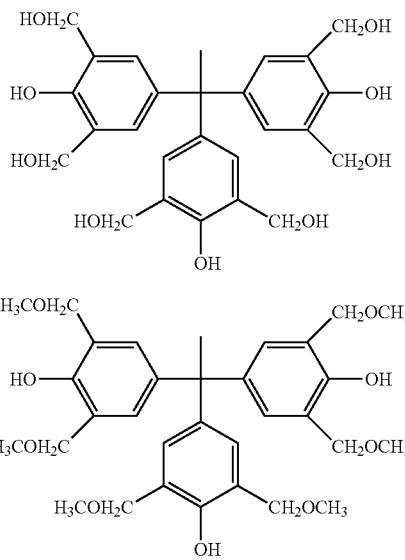

Formula (4-26)

Formula (4-27)

The aforementioned compounds are available as products from Asahi Organic Chemicals Industry Co., Ltd., and Honshu Chemical Industry Co., Ltd. Among the crosslinkers, for example, the compound of Formula (4-21) is available as trade name TM-BIP-A available from Asahi Organic Chemicals Industry Co., Ltd.

The amount of the crosslinker to be added varies depending on a coating solvent to be used, an underlying substrate to be used, a solution viscosity to be required, and a film form to be required. The amount is 0.001 to 80% by mass, preferably 0.01 to 50% by mass, and further preferably 0.05 to 40% by mass, relative to the total solid content. The crosslinker may cause a crosslinking reaction due to self-condensation. However, when the aforementioned polymer of the present invention has a crosslinkable substituent, the crosslinkable substituent may be subjected to a crosslinking reaction.

In the present invention, as an acid catalyst for promoting the crosslinking reaction, an acidic compound such as p-toluenesulfonic acid, trifluoromethanesulfonic acid, pyridinium p-toluenesulfonate, salicylic acid, sulfosalicylic acid, citric acid, benzoic acid, hydroxybenzoic acid, or naphthalenecarboxylic acid, and/or a thermal acid generator such as 2,4,4,6-tetrabromocyclohexadienone, benzoin tosylate, 2-nitrobenzyl tosylate, or another organic alkyl sulfonate ester can be mixed. The amount of the acid catalyst to be mixed is 0.0001 to 20% by mass, preferably 0.0005 to 10% by mass, and further preferably 0.01 to 3% by mass, relative to the total solid content.

The composition may contain a surfactant. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl allyl ethers such as polyoxyethylene octyl phenol ether and polyoxyethylene nonyl phenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop EF301, EF303, and EF352 (trade name, available from Tohkem Products Corporation), MEGAFACE F171, F173, R-30, and R-30N (trade name, available from DIC Corporation), Fluorad FC430 and FC431 (trade name, available from Sumitomo 3M, Ltd.), and AsahiGuard AG710 and Surflon S-382, SC101, SC102, SC103, SC104, SC105, and SC106 (trade name, available from Asahi Glass Co., Ltd.), and organosiloxane polymer KP341 (available from Shin-Etsu Chemical Co., Ltd.). The amount of the surfactant to be mixed is usually 2.0% by mass or less, and preferably 1.0% by mass or less, relative to the total solid content of the peeling layer-forming composition used in the present invention. The surfactant may be added alone, or two or more types thereof may be added in combination.

As a solvent capable of dissolving the polymer, the crosslinker component, the crosslinking catalyst, and the like, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, or the like may be used. The organic solvent is used alone, or two or more types thereof are used in combination.

A baking condition after applying the peeling layer-forming composition to a support by a spin coater or the like includes 80 to 350° C. and 0.5 to 120 minutes.

In the present invention, the laminated body can be produced by applying the adhesive for forming the adhesion layer to a circuit surface of a wafer to form the adhesion layer, applying the peeling layer-forming composition for forming the peeling layer to a support to form the peeling layer, and bonding the wafer and the support so that the adhesion layer is in contact with the peeling layer followed by heating at 120° C. to 300° C., to achieve joining.

Examples of the wafer include a silicon wafer having a diameter of 300 mm and a thickness of about 770 μm.

Examples of the support (carrier) include a glass wafer and a silicon wafer that have a diameter of 300 mm and a thickness of about 700 mm.

The laminated body can be formed by applying the adhesive to a circuit surface of the wafer by a spin coater with a back surface of the wafer disposed downwardly to form the adhesion layer, bonding the wafer and a support having the peeling layer formed so as to dispose the adhesive between the support and the wafer, and heating the adhesive at a temperature of 120 to 260° C., resulting in curing. Curing of the adhesive starts at a heating temperature of about 120° C. The heating temperature may be 260° C. or higher. From the viewpoint of heat resistance of the circuit surface (device surface) of the wafer, the heating temperature is preferably 260° C. or lower, for example, about 150° C. to about 230° C., or about 190° C. to about 200° C. The heating time is, for example, 1 to 30 minutes. From the viewpoint of degree of advance of curing of the adhesive, the heating time is preferably 3 minutes or more. From the viewpoint of throughput, the heating time is preferably 10 minutes or less.

In order to adjust the viscosity of the adhesive, a solvent may be added. Examples of the solvent include hydrocarbon-based solvents such as isoparaffin, p-menthane, hexane, and undecane, aromatic hydrocarbon-based solvent such as toluene, mesitylene, and p-cymene, ester-based solvents such as butyl acetate, and halogen-based solvents such as chloroform. The amount of the solvent to be added to the adhesive may be an optional ratio.

For heating, a hot plate is used. Heating can be carried out from any one of the wafer side and the support side.

When the support and the wafer are joined under reduced pressure (e.g., a reduced pressure of 10 Pa to 10,000 Pa) so that the peeling layer and the adhesion layer are disposed between the support and the wafer, the laminated body can be formed. The support and the wafer can be joined by heating only a lower surface under reduced pressure. For example, heating can be carried out at 120° C. to 260° C. By this heating, the adhesion layer is cured.

The thickness of the adhesion layer formed by applying the adhesive may be 5 to 500 μm, 10 to 200 μm, 20 to 150 μm, 30 to 120 μm, or 30 to 70 μm.

The thickness of the peeling layer formed by applying the peeling layer-forming composition may be 5 to 10,000 nm, 10 to 5,000 nm, 50 to 1,000 nm, or 100 to 500 nm.

In processing of a side opposite to the circuit surface of the wafer, for example, the wafer is made thin by polishing. A through silicon via (TSV) or the like is then formed, the thinned wafer is peeled from the support, and a laminated body of the wafer is formed. Thus, three-dimensional mounting is carried out. Before or after this time, an electrode or the like on the back surface of the wafer is also formed. In thinning of the wafer and a TSV process, the wafer attached to the support is heated at 250 to 350° C. However, a laminated body as a temporary adhesive used in the present invention has heat resistance to 250 to 350° C.

For example, a wafer having a diameter of 300 mm and a thickness of about 770 μm can be made thin to a thickness of about 80 μm to about 4 μm by polishing a back surface opposite to the circuit surface.

After adhesion and processing (polishing) of the back surface, the wafer is peeled from the support. In a peeling method, peeling is carried out by laser irradiation from the support side. As laser, ultraviolet light with a wavelength of 190 nm to 400 nm or 190 nm to 600 nm (e.g., 308 nm, 355 nm, 532 nm) is used.

Peeling can be carried out by a pulsed laser at a processing energy density of about 50 to 500 mJ/cm$^2$.

After the peeling, the peeling layer is hardly attached to the support, but the support can be washed with a cleaner such as a solvent. As the cleaner, for example, a cleaner liquid containing a fluoride salt such as quaternary ammonium fluoride, an organic base such as diazabicycloundecene, and an organic solvent can be used.

For separation of the adhesive on the wafer side, separation using a solvent, a peeling method using a tape, or the like is used. For separation between the wafer and the adhesive, for example, a tape peeling method in which a commercially available tape is attached to an adhesive surface on the wafer, and peeled at an angle of 60° to 180° relative to the wafer surface, to separate the wafer and the adhesive can be used.

EXAMPLES (Production of Adhesive A for Forming Adhesion Layer)

95 g of vinyl group-containing MQ resin (available from Wacker Chemie AG) as a polysiloxane (a1), 93.4 g of p-menthane (available from Nippon Terpene Chemicals, Inc.) as a dilution solvent, and 0.41 g of 1,1-diphenyl-2-propyn-1-ol (available from Tokyo Chemical Industry Co., Ltd.) were placed in a 600-mL stirring container for a planetary centrifugal mixer (ARE-500 manufactured by THINKY CORPORATION), and stirred for 5 minutes by the planetary centrifugal mixer (ARE-500 manufactured by THINKY CORPORATION). To the obtained mixture, a SiH group-containing linear polydimethylsiloxane having a viscosity of 100 mPa·s (available from Wacker Chemie AG) as a polysiloxane (a2), 29.5 g of vinyl group-containing linear polydimethylsiloxane having a viscosity of 200 mPa·s (available from Wacker Chemie AG) as a polysiloxane (a2), a polyorganosiloxane having a viscosity of 1,000,000 mm$^2$/s (trade name: AK1000000, available from Wacker Chemie AG) as a component (B), and 0.41 g of 1-ethynylcyclohexanol (available from Wacker Chemie AG) as (A3) were added, and the mixture was stirred for 5 minutes by the planetary centrifugal mixer (ARE-500, manufactured by THINKY CORPORATION). Separately, 0.20 g of platinum catalyst (available from Wacker Chemie AG) as (A2) and 17.7 g of vinyl group-containing linear polydimethylsiloxane having a viscosity of 1,000 mPa·s (available from Wacker Chemie AG) as a polysiloxane (a2) were stirred in a 50-mL screw tube (AS ONE Corporation) for 5 minutes by the planetary centrifugal mixer (ARE-500 manufactured by THINKY CORPORATION) to obtain a mixture. 14.9 g of the mixture was added to the aforementioned mixture, and stirred for 5 minutes by the planetary centrifugal mixer (ARE-500 manufactured by THINKY CORPORATION). Finally, the mixture was filtrated through a 300-mesh nylon filter, to obtain an adhesive (A). The viscosity of the adhesive was measured by a rotary viscometer (TVE-22H manufactured by TOKI SANGYO CO., LTD.) to be 2,400 mPa·s.

Synthesis of Polymer Contained in Peeling Layer

Synthesis Example 1

In a 100-mL four-neck flask, 8 g of carbazole (available from Tokyo Chemical Industry Co., Ltd.), 7.55 g of 1-naphthaldehyde (available from Tokyo Chemical Industry Co., Ltd.), and 0.95 g of p-toluenesulfonic acid monohydrate (available from Kanto Chemical Co., Inc.) were placed under nitrogen, and 8 g of 1,4-dioxane (available from Kanto Chemical Co., Inc.) was added. The mixture was stirred, heated to 100° C., and then dissolved to initiate polymerization. After 4 hours, the resultant was allowed to cool to 60° C., diluted with 40 g of chloroform (available from Kanto Chemical Co., Inc.), and reprecipitated in 200 g of methanol. The obtained precipitate was filtered, and dried at 60° C. for 10 hours and at 120° C. for 24 hours by a reduced-pressure dryer, to obtain 10.03 g of target polymer (a polymer having a unit structure of Formula (C1-1-1-1), hereinafter abbreviated as PCzNA).

The weight average molecular weight Mw measured by GPC of PCzNA was 2,600 in terms of polystyrene.

Synthesis Example 2

In a 300-mL four-neck flask, 15.00 g of 4,4-biphenol (available from Tokyo Chemical Industry Co., Ltd.), 18.55 g of 1-pyrenecarboxaldehyde (available from Aldrich), and 33.210 g of p-toluenesulfonic acid monohydrate (available from Tokyo Chemical Industry Co., Ltd.) were placed under nitrogen, and 44.93 g of propylene glycol monomethyl ether (available from Kanto Chemical Co., Inc.) was added. The mixture was stirred, heated to 120° C., and then dissolved to initiate polymerization. After 24 hours, the resultant was allowed to cool to room temperature, and reprecipitated in 1,800 g of methanol. The obtained precipitate was filtered, and dried at 50° C. for 10 hours by a reduced-pressure dryer, to obtain 19.08 g of target polymer (a polymer having a unit structure of Formula (C1-3-1-4), hereinafter abbreviated as PBPPCA). The weight average molecular weight Mw measured by PBPPCA was 2,200 in terms of polystyrene.

Synthesis Example 3

9.00 g of carbazole (available from Tokyo Chemical Industry Co., Ltd.), 2.16 g of 1,5-dihydroxynaphthalene (available from Tokyo Chemical Industry Co., Ltd.), 15.63 g of 1-pyrenecarboxaldehyde (available from Aldrich), and 0.54 g of p-toluenesulfonic acid monohydrate (available from Tokyo Chemical Industry Co., Ltd.) were added to 40.98 g of p-xylene, and then stirred with reflux for about 5 hours under nitrogen flow. After completion of the reaction, the resultant was diluted with 66.15 g of tetrahydrofuran. The reaction solution was cooled, and added dropwise to a methanol/28% ammonia water (700 g/7 g) mixed solution, resulting in reprecipitation. The obtained precipitate was filtered under suction, and the obtained powder was dried at 85° C. overnight under reduced pressure. After then, 21.41 g of target polymer (a polymer having a unit structure of Formula (C1-1-1-1) and a unit structure of Formula (C1-3-1-5), hereinafter abbreviated as PCzNP) was obtained. The weight average molecular weight of the obtained polymer was 5,900 in terms of polystyrene.

Synthesis Example 4

In a flask, 13.0 g of carbazole (available from Tokyo Chemical Industry Co., Ltd.), 10.3 g of dicyclopentadiene (available from Tokyo Chemical Industry Co., Ltd.), and toluene were placed under nitrogen, and 0.12 g of trifluoromethanesulfonic acid (available from Tokyo Chemical Industry Co., Ltd.) was added. The mixture was stirred, heated to 120° C., and then dissolved to initiate polymerization. After 21 hours, the resultant was allowed to cool to room temperature, and diluted with 30 g of chloroform (available from Kanto Chemical Co., Inc.), and the insoluble substance was filtered off, and reprecipitation was caused in 1,500 g of methanol (available from Kanto Chemical Co., Inc.). The obtained precipitate was filtered, and dried at 60° C. for 20 hours by a reduced-pressure dryer, to obtain 11.6 g of target polymer (a polymer having a unit structure of Formula (C1-2-1-1), hereinafter abbreviated as PCzHDC).

The weight average molecular weight Mw measured by GPC of the obtained polymer was 2,000 in terms of polystyrene.

Synthesis Example 5

86.36 g of 1,4-dioxane and 86.36 g of toluene were added to 56.02 g of 1-phenylnaphthylamine, 50.00 g of 1-pyrenecarboxyaldehyde (available from Maruzen Kagaku Kogyo), 6.67 g of 4-(trifluoromethyl)benzaldehyde, and 2.46 g of methanesulfonic acid, and the mixture was stirred with reflux for 18 hours under a nitrogen atmosphere. After completion of the reaction, the resultant was diluted with 96 g of tetrahydrofuran, and the diluent was added dropwise to methanol to obtain a precipitate. The obtained precipitate was filtered, washed with methanol, and dried at 60° C. under reduced pressure to obtain 72.12 g of novolac resin (polymer having a unit structure of Formula (C1-1-2-1) and a unit structure of Formula (C1-1-2-2), hereinafter abbreviated as PPNAPCA-F). The weight average molecular weight measured by GPC of the resin was 1,100 in terms of standard polystyrene.

(Preparation of Peeling Layer-Forming Composition)
(Peeling Layer-Forming Composition 1)

20 g of commercially available cresol novolac resin (Formula (C1-3-1-1), available from Gun Ei Chemical Industry Co., Ltd.) was dissolved in 80 g of propylene glycol monomethyl ether acetate to obtain a solution. Subsequently, the solution was filtered through a polyethylene microfilter with a pore diameter of 0.2 µm to prepare a solution of peeling layer-forming composition 1 for use in laser debonding (peeling of a support and a wafer by laser irradiation).

(Peeling Layer-Forming Composition 2)

30 g of commercially available biphenol novolac resin (Formula (C1-3-1-3), available from Nippon Kayaku Co., Ltd.) was dissolved in 331 g of propylene glycol monomethyl ether acetate to obtain a solution. Subsequently, the solution was filtered through a polyethylene microfilter with a pore diameter of 0.2 µm to prepare a solution of peeling layer-forming composition 2 for use in laser debonding.

(Peeling Layer-Forming Composition 3)

10 g of commercially available naphthol novolac resin (Formula (C1-3-1-2), available from Asahi Organic Chemicals Industry Co., Ltd.) was dissolved in 88 g of propylene glycol monomethyl ether acetate to obtain a solution. Subsequently, the solution was filtered through a polyethylene microfilter with a pore diameter of 0.2 µm to prepare a solution of peeling layer-forming composition 3 for use in laser debonding.

(Peeling Layer-Forming Composition 4)

33 g of the polymer obtained in Synthesis Example 2 (PBPPCA) was dissolved in 477 g of cyclohexanone, and the solution was filtered through a polyethylene microfilter with a pore diameter of 0.2 µm to prepare a solution of peeling layer-forming composition 4 for use in laser debonding.

(Peeling Layer-Forming Composition 5)

60 g of the polymer obtained in Synthesis Example 1 (PCzNA) was dissolved in 849 g of propylene glycol monomethyl ether acetate, and the solution was filtered through a polyethylene microfilter with a pore diameter of 0.2 µm to prepare a solution of peeling layer-forming composition 5 for use in laser debonding.

(Peeling Layer-Forming Composition 6)

With 9.2 g of the polymer obtained in Synthesis Example 1 (PCzNA), 0.4 g of tetramethoxymethyl glycoluril as a crosslinker, 0.04 g of pyridinium p-toluenesulfonate as an acid catalyst, and 3 mg of R-30N (available from Dainippon Ink and Chemicals, Inc.) as a surfactant were mixed, and the mixture was dissolved in 15.3 g of propylene glycol monomethyl ether acetate, 7.2 g of propylene glycol monomethyl ether, and 7.2 g of cyclohexanone to obtain a solution. Subsequently, the solution was filtered through a polyethylene microfilter with a pore diameter of 0.2 µm to prepare a solution of peeling layer-forming composition 6 for use in laser debonding.

(Peeling Layer-Forming Composition 7)

With 2.0 g of the resin obtained in Synthesis Example 3 (PCzNP), 0.006 g of R-30N (available from Dainippon Ink and Chemicals, Inc.) as a surfactant was mixed, and the mixture was dissolved in 3.97 g of propylene glycol monomethyl ether acetate, 2.16 g of propylene glycol monomethyl ether, and 18.84 g of cyclohexanone to obtain a solution. Subsequently, the solution was filtered through a polyethylene microfilter with a pore diameter of 0.2 µm to prepare a solution of peeling layer-forming composition 7 for use in laser debonding.

(Peeling Layer-Forming Composition 8)

With 1.0 g of the polymer compound obtained in Synthesis Example 4 (PCzHDC), 0.2 g of tetramethoxymethyl glycoluril as a crosslinker, 0.02 g of pyridinium p-toluenesulfonate as an acid catalyst, 0.003 g of R-30N (trade name, available from Dainippon Ink and Chemicals, Inc.) as a surfactant, 2.3 g of propylene glycol monomethyl ether, 4.6 g of propylene glycol monomethyl ether acetate, and 16.3 g of cyclohexanone were mixed to obtain a solution. Subsequently, the solution was filtered through a polyethylene microfilter with a pore diameter of 0.2 µm to prepare a solution of peeling layer-forming composition 8 for use in laser debonding.

(Peeling Layer-Forming Composition 9)

60 g of the resin obtained in Synthesis Example 5 (PPNAPCA-F) was dissolved in 849 g of propylene glycol monomethyl ether acetate, and the solution was filtered through a polyethylene microfilter with a pore diameter of 0.2 µm to prepare a solution of peeling layer-forming composition 9 for use in laser debonding.

(Peeling Layer-Forming Composition 10)

With 20 g of the resin obtained in Synthesis Example 5 (PPNAPCA-F), 4.0 g of TMOM-BP (trade name, available from Honshu Chemical Industry Co., Ltd.) as a crosslinker, 0.60 g of pyridinium p-toluenesulfonate as an acid catalyst, and 0.06 g of R-30N (trade name, available from Dainippon Ink and Chemicals, Inc.) as a surfactant were mixed, and the mixture was dissolved in 100.8 g of propylene glycol monomethyl ether and 100.8 g of propylene glycol monomethyl ether acetate to obtain a solution. Subsequently, the solution was filtered through a polyethylene microfilter with a pore diameter of 0.2 µm to prepare a solution of peeling layer-forming composition 10 for use in laser debonding.

(Peeling Layer-Forming Composition for Comparison 1)

3 g of commercially available polystyrene (available from Sigma-Aldrich Co. LLC.) was dissolved in 97 g of cyclohexanone to obtain a solution as a comparison example. Subsequently, the solution was filtered through a polyethylene microfilter with a pore diameter of 0.2 µm to prepare a solution of peeling layer-forming composition for comparison 1.

(Example 1) Measurement of Transmittance of Peeling Layer

Each of the peeling layer-forming compositions was applied to a quartz substrate by a spin coater, and heated on a hot plate at a temperature of 250° C. for 1 minute to form a peeling layer (film thickness: 0.2 µm). In order to judge whether the peeling layers could be used as a peeling layer for laser debonding, the transmittances of the peeling layers to light having a wavelength of 308 nm and 355 nm were measured by an ultraviolet-visible spectroscopy (UV2550 manufactured by Shimadzu Corporation). The results are shown in Tables 1 and 2.

TABLE 1

Measurement of Transmittance to
Light Having Wavelength of 308 nm

|  | Transmittance [%] at 308 nm |
|---|---|
| Peeling layer (1) | 73.9 |
| Peeling layer (2) | 57.3 |
| Peeling layer (3) | 10.0 |
| Peeling layer (4) | 16.6 |
| Peeling layer (5) | 3.4 |
| Peeling layer (6) | 6.3 |
| Peeling layer (7) | 8.7 |
| Peeling layer (8) | 31.0 |
| Peeling layer (9) | 13.4 |
| Peeling layer (10) | 15.3 |
| Comparative peeling layer (1) | 96.4 |

In the results of measurement of transmittance, although the transmittances of the peeling layers (1) and (2) are relatively high as a peeling layer, the transmittances of the peeling layers (3) to (10) are low, which are good results. The transmittance of the comparative peeling layer (1) is very high.

Next, the transmittances to light having a wavelength of 355 nm are shown in Table 2.

TABLE 2

Measurement of Transmittance to
Light Having Wavelength of 355 nm

|  | Transmittance [%] at 355 nm |
|---|---|
| Peeling layer (1) | 87.5 |
| Peeling layer (2) | 79.5 |
| Peeling layer (3) | 25.3 |
| Peeling layer (4) | 2.8 |
| Peeling layer (5) | 68.2 |
| Peeling layer (6) | 69.2 |
| Peeling layer (7) | 2.2 |
| Peeling layer (8) | 72.1 |
| Peeling layer (9) | 2.0 |
| Peeling layer (10) | 5.2 |
| Comparative peeling layer (1) | 99.2 |

In the results of measurement of transmittance, although the transmittances of the peeling layers (1), (2), (5), (6), and (8) are relatively high, the transmittances of the peeling layers (4), (7), (9), and (10) are low, which are good results. The transmittance of the comparative peeling layer (1) is very high.

(Example 2) 308 nm Laser Irradiation Test, Confirmation of Optimal Irradiation Dose To a 100-mm glass wafer (EAGLE-XG, available from Corning Incorporated, thickness: 500 μm) as a wafer (support) on a carrier side, each of the peeling layer-forming compositions (1) to (8) and the comparative peeling layer-forming composition (1) was applied by a spin coater, and heated on a hot plate at a temperature of 250° C. for 1 minute to form each of peeling layers (1) to (8) and comparative peeling layer (1).

To a 100-mm silicon wafer (thickness: 500 μm) as a wafer on a device side, the adhesive A was applied by a spin coater, and heated at 120° C. for 1 minute to form an adhesion layer A. The glass wafer having the laser peeling layer (wafer on the carrier side) produced in advance was bonded to the wafer on the device side so that the peeling layer and the adhesion layer A were disposed between the wafers in a vacuum bonder (manual bonder, manufactured by SUSS MicroTec KK). Thus, a laminated body was produced. Subsequently, the laminated body was heated on a hot plate at 200° C. for 10 minutes with the wafer on the device side disposed downwardly, to cure the adhesion layer A. The obtained laminated body was irradiated with a laser by a laser irradiation device (M-3T manufactured by MARUBUN CORPORATION) from the glass wafer side. The optimal irradiation dose was set to the lowest dose causing peeling at an output range of 80 to 400 mJ/cm$^2$. The results are shown in Table 3.

TABLE 3

308 nm Laser Iirradiation Test

|  | Optimal irradiation dose [mJ/cm$^2$] |
|---|---|
| Peeling layer (1) | 360 |
| Peeling layer (2) | 320 |
| Peeling layer (3) | 160 |
| Peeling layer (4) | 200 |
| Peeling layer (5) | 160 |
| Peeling layer (6) | 140 |
| Peeling layer (7) | 120 |
| Peeling layer (8) | 160 |
| Comparative peeling layer (1) | Not peeled (400 or more) |

In the laminated body using each of the peeling layers (3) to (8) having low transmittance, peeling was confirmed at low irradiation dose. In the laminated body using each of the peeling layers (1) and (2), high irradiation dose was required, but occurrence of peeling was confirmed.

(Example 3) 308 nm Laser Debonding Test

To a 100-mm glass wafer (EAGLE-XG, available from Corning Incorporated, thickness: 500 μm) as a wafer (support) on a carrier side, the peeling layer-forming compositions (1) to (8) and the comparative peeling layer-forming composition (1) were applied by a spin coater, and heated on a hot plate at a temperature of 250° C. for 1 minute to form peeling layers (1) to (8) and comparative peeling layer (1), respectively.

To a 100-mm silicon wafer (thickness: 500 μm) as a wafer on a device side, the adhesive A was applied by a spin coater, and heated at 120° C. for 1 minute to form an adhesion layer A. The glass wafer having the laser peeling layer (wafer on the carrier side) produced in advance was bonded to the wafer on the device side so that the peeling layer and the adhesion layer A were disposed between the wafers in a vacuum bonder (manual bonder, manufactured by SUSS MicroTec KK). Thus, a laminated body was produced. Subsequently, the laminated body was heated on a hot plate at 200° C. for 10 minutes with the wafer on the device side disposed downwardly, to cure the adhesion layer A. The whole surface of the wafer of the obtained laminated body was irradiated with a laser of 308 nm by a laser irradiation device (M-3T manufactured by MARUBUN CORPORATION) from the glass wafer side. Thus, whether the glass wafer could be peeled was confirmed. At that time, the output of the laser was in accordance with conditions determined in Table 3, and irradiation with the laser was carried out so that the leaser did not overlap in front-rear and left-right directions. A case where easy peeling is possible after laser irradiation is represented by "0," and a case where peeling is impossible after laser irradiation is represented by "x." The results are shown in Table 4.

TABLE 4

308 nm Laser Debonding Test

| | Optimal irradiation dose [mJ/cm²] | Peeling Properties |
|---|---|---|
| Peeling layer (1) | 360 | ○ |
| Peeling layer (2) | 320 | ○ |
| Peeling layer (3) | 160 | ○ |
| Peeling layer (4) | 200 | ○ |
| Peeling layer (5) | 160 | ○ |
| Peeling layer (6) | 140 | ○ |
| Peeling layer (7) | 120 | ○ |
| Peeling layer (8) | 160 | ○ |
| Comparative peeling layer (1) | 400 | X |

In the laminated bodies using the peeling layers (1) to (8), it was confirmed that the glass wafer (carrier side) was easily peeled after laser irradiation. On the other hand, in the laminated body using the comparative peeling layer (1), the glass wafer was not easily peeled.

(Example 4) (Confirmation 1 of Heat Generation by Irradiation with Laser of 308 nm after Formation of Peeling Layer on Silicon Wafer)

The peeling layer-forming compositions (5) to (8) that had good peeling properties were applied to a 100-mm silicon wafer (thickness: 500 μm) by a spin coater, and heated on a hot plate at a temperature of 250° C. for 1 minute to form peeling layers (5) to (8), respectively. In order to determine the presence or absence of heat generation of the peeling layers during laser irradiation, a thermo-label (trade name: Temp-plate, available from Wahl, corresponding to 76° C. to 260° C., the lowest detection temperature: 76° C.) was attached to a back surface of the silicon wafer having the peeling layer. The laminated body was irradiated with a laser by a laser irradiation device (M-3T manufactured by MARUBUN CORPORATION) from a side where the peeling layer was formed. The presence or absence of detection of heat generation by the thermo-label was confirmed. At that time, the output of the laser was in accordance with the conditions determined in Table 3.

In order to confirm the presence or absence of heat generation after laser irradiation by a procedure other than the thermo-label, the temperature of the peeling layer immediately after laser irradiation was measured by an infrared thermometer (manufactured by Testo K.K.). The temperature of the peeling layer before the laser irradiation was about 24° C. The results are shown in Table 5.

TABLE 5

Confirmation and Verification 1 of Presence or Absence of Heat Generation by Irradiation with Laser of 308 nm

| | Thermo-label | Infrared thermometer |
|---|---|---|
| Peeling layer (5) | Heat generation was not detected | 24.7° C. |
| Peeling layer (6) | Heat generation was not detected | 23.5° C. |
| Peeling layer (7) | Heat generation was not detected | 23.5° C. |
| Peeling layer (8) | Heat generation was not detected | 23.8° C. |

The thermo-label was checked after irradiation with a laser of 308 nm. Heat generation was not detected, that was, an increase in temperature of the peeling layer was confirmed to be less than 76° C. On the other hand, the infrared thermometer was checked after irradiation with a laser of 308 nm, and the increase in temperature was not found. Therefore, the absence of heat generation caused by laser irradiation was considered.

(Example 5) (Confirmation 2 of Heat Generation by Irradiation with Laser of 308 nm after Formation of Peeling Layer on Glass Wafer)

The laser peeling layer-forming compositions (5) to (8) that had good peeling properties were applied to a glass wafer by a spin coater, and heated on a hot plate at a temperature of 250° C. for 1 minute to form peeling layers (5) to (8), respectively. In order to determine the presence or absence of heat generation during laser irradiation, a thermo-label (trade name: Temp-plate, available from Wahl, corresponding to 76° C. to 260° C., the lowest detection temperature: 76° C.) was attached directly to the peeling layer. The laminated body was irradiated with a laser by a laser irradiation device (M-3T manufactured by MARUBUN CORPORATION) from a side of the glass wafer. The presence or absence of detection of heat generation by the thermo-label was confirmed. At that time, the output of the laser was in accordance with the conditions determined in Table 3.

In order to confirm the presence or absence of heat generation after laser irradiation by a procedure other than the thermo-label, the temperature of the glass wafer immediately after laser irradiation was measured by a thermoelectric couple thermometer (trade name: Handheld Thermometer, manufactured by Anritsu Meter Co., Ltd.) as a contact thermometer, and the temperature of the peeling layer immediately after laser irradiation was measured by an infrared thermometer (manufactured by Testo K.K.) as a non-contact thermometer. The temperature of the wafer before the laser irradiation measured by the thermoelectric couple thermometer and that measured by the infrared thermometer were about 24° C. The results are shown in Table 6.

TABLE 6

Confirmation and Verification 2 of Presence or Absence of Heat Generation by Irradiation with Laser of 308 nm

| | Thermo-label | Thermoelectric couple thermometer | Infrared thermometer |
|---|---|---|---|
| Peeling layer (5) | Heat generation was not detected | 24.2° C. | 24.1° C. |
| Peeling layer (6) | Heat generation was not detected | 24.2° C. | 24.1° C. |
| Peeling layer (7) | Heat generation was not detected | 24.2° C. | 24.4° C. |
| Peeling layer (8) | Heat generation was not detected | 24.4° C. | 24.4° C. |

The thermo-label was checked after laser irradiation. Heat generation was not detected, that was, an increase in temperature of the peeling layer was confirmed to be less than 76° C. The infrared thermometer and the thermoelectric couple thermometer were checked immediately after laser irradiation. In all the samples, an increase in temperature was not confirmed. Therefore, the absence of heat generation caused by irradiation with a laser of 308 nm was considered.

(Example 6) (355 nm Laser Irradiation Test, Confirmation of Optimal Irradiation Dose)

To a 100-mm glass wafer (EAGLE-XG, available from Corning Incorporated, thickness: 500 µm) as a wafer (support) on a carrier side, the peeling layer-forming compositions (1) to (8) and the comparative peeling layer-forming composition (1) were applied by a spin coater, and heated on a hot plate at a temperature of 250° C. for 1 minute to form peeling layers (1) to (8) and comparative peeling layer (1), respectively.

To a 100-mm silicon wafer (thickness: 500 µm) as a wafer on a device side, the adhesive A was applied by a spin coater, to form an adhesion layer A, and the adhesion layer A was heated at 120° C. for 1 minute. The glass wafer having the laser peeling layer (wafer on the carrier side) produced in advance was bonded to the wafer on the device side so that the laser peeling layer and the adhesion layer A were disposed between the wafers in a vacuum bonder (manual bonder, manufactured by SUSS MicroTec KK). Thus, a laminated body was produced. Subsequently, the laminated body was heated on a hot plate at 200° C. for 10 minutes with the wafer on the device side disposed downwardly, to cure the adhesion layer A. The obtained laminated body was irradiated with a laser by a laser irradiation device (LSL-10 manufactured by Optopia Co., Ltd.) from the glass wafer side. The optimal irradiation dose was set to the lowest dose causing peeling at an output range of 80 to 400 mJ/cm². The results are shown in Table 7.

TABLE 7

355 nm Laser Iirradiation Test

| | Optimal irradiation dose [mJ/cm²] |
|---|---|
| Peeling layer (1) | 380 |
| Peeling layer (2) | 400 |
| Peeling layer (3) | 100 |
| Peeling layer (4) | 80 |
| Peeling layer (5) | 160 |
| Peeling layer (6) | 160 |
| Peeling layer (7) | 100 |
| Peeling layer (8) | 160 |
| Peeling layer (9) | 100 |
| Peeling layer (10) | 100 |
| Comparative peeling layer (1) | Not peeled (400 or more) |

In the laminated bodies using the peeling layers (3) to (10) having low transmittance, peeling was confirmed at a low irradiation dose. In the laminated bodies using the peeling layers (1) and (2), high irradiation dose was required, but occurrence of peeling was confirmed.

(Example 7) 355 nm Laser Debonding Test

To a 100-mm glass wafer (EAGLE-XG, available from Corning Incorporated, thickness: 500 µm) as a wafer (support) on a carrier side, the peeling layer-forming compositions (1) to (8) and the comparative peeling layer-forming composition (1) were applied by a spin coater, and heated on a hot plate at a temperature of 250° C. for 1 minute to form peeling layers (1) to (8) and comparative peeling layer (1), respectively.

To a 100-mm silicon wafer (thickness: 500 µm) as a wafer on a device side, the adhesive A was applied by a spin coater, and heated at 120° C. for 1 minute to form an adhesion layer A. The glass wafer having the laser peeling layer (wafer on the carrier side) produced in advance was bonded to the wafer on the device side so that the laser peeling layer and the adhesion layer A were disposed between the wafers in a vacuum bonder (manual bonder, manufactured by SUSS MicroTec KK). Thus, a laminated body was produced. Subsequently, the laminated body was heated on a hot plate at 200° C. for 10 minutes with the wafer on the device side disposed downwardly, to cure the adhesion layer A. The whole surface of the wafer of the obtained laminated body was irradiated with a laser of 308 nm by a laser irradiation device (LSL-10 manufactured by Optopia Co., Ltd.) from the glass wafer side. Thus, whether the glass wafer could be peeled was confirmed. At that time, the output of the laser was in accordance with the conditions determined in Table 3, and irradiation was carried out so that the laser overlapped at 50% in front-rear and left-right directions. A case where easy peeling is possible after laser irradiation is represented by "◯," and a case where peeling is impossible after laser irradiation is represented by "×." The results are shown in Table 8.

TABLE 8

355 nm Laser Debonding Test

| | Optimal irradiation dose [mJ/cm²] | Peeling Properties |
|---|---|---|
| Peeling layer (1) | 380 | ◯ |
| Peeling layer (2) | 400 | ◯ |
| Peeling layer (3) | 100 | ◯ |
| Peeling layer (4) | 80 | ◯ |
| Peeling layer (5) | 160 | ◯ |
| Peeling layer (6) | 160 | ◯ |
| Peeling layer (7) | 100 | ◯ |
| Peeling layer (8) | 160 | ◯ |
| Peeling layer (9) | 100 | ◯ |
| Peeling layer (10) | 100 | ◯ |
| Comparative peeling layer (1) | 400 | X |

In the laminated bodies using the peeling layers (3) to (10), it was confirmed that the glass wafer (carrier side) was easily peeled after laser irradiation. In a case of using the peeling layers (1) and (2), high irradiation dose was required. On the other hand, in the laminated body using the comparative peeling layer (1), the glass wafer was not easily peeled.

(Example 8) (Confirmation 1 of Heat Generation by Irradiation with Laser of 355 nm after Formation of Peeling Layer on Silicon Wafer)

The peeling layer-forming compositions (4) to (10) that had good peeling properties were applied to a 100-mm silicon wafer (thickness: 500 µm) by a spin coater, and heated on a hot plate at a temperature of 250° C. for 1 minute to form peeling layers (4) to (10), respectively. In order to determine the presence or absence of heat generation of the peeling layers during laser irradiation, a thermo-label (trade name: Temp-plate, available from Wahl, corresponding to 76° C. to 260° C., the lowest detection temperature: 76° C.) was attached to a back surface of the silicon wafer having the peeling layer. The laminated body was irradiated with a laser by a laser irradiation device (LSL-10 manufactured by Optopia Co., Ltd.) from a side where the peeling layer was formed. The presence or absence of detection of heat generation by the thermo-label was confirmed. At that time, the output of the laser was in accordance with conditions determined in Table 7.

In order to confirm the presence or absence of heat generation after laser irradiation by a procedure other than the thermo-label, the temperature of the peeling layer immediately after laser irradiation was measured by an infrared thermometer (manufactured by Testo K.K.) as a non-contact thermometer, and the temperature of the glass wafer immediately after laser irradiation was measured by a thermoelectric couple thermometer (trade name: Handheld Thermometer, manufactured by Anritsu Meter Co., Ltd.) as a contact thermometer. The temperature of the peeling layer before the laser irradiation measured by the thermoelectric couple thermometer and that measured by the infrared thermometer were about 28° C. The results are shown in Table 9.

TABLE 9

Confirmation and Verification 1 of Presence or Absence of Heat Generation by Irradiation with Laser of 355 nm

| | Thermo-label | Thermoelectric couple thermometer | Infrared thermometer |
|---|---|---|---|
| Peeling layer (4) | Heat generation was not detected | 27.9° C. | 25.4° C. |
| Peeling layer (5) | Heat generation was not detected | 27.7° C. | 27.2° C. |
| Peeling layer (6) | Heat generation was not detected | 28.2° C. | 26.9° C. |
| Peeling layer (7) | Heat generation was not detected | 27.9° C. | 25.5° C. |
| Peeling layer (8) | Heat generation was not detected | 27.9° C. | 25.5° C. |
| Peeling layer (9) | Heat generation was not detected | 28.2° C. | 26.3° C. |
| Peeling layer (10) | Heat generation was not detected | 27.9° C. | 25.5° C. |

The thermo-label was checked after laser irradiation. In all the samples, heat generation was not detected, that was, an increase in temperature of the peeling layer was confirmed to be less than 76° C. The infrared thermometer and the thermoelectric couple thermometer were checked immediately after laser irradiation. In all the samples, an increase in temperature was not confirmed. Therefore, the absence of heat generation caused by irradiation with a laser of 355 nm was considered.

(Example 9) (Confirmation 2 of Heat Generation by Irradiation with Laser of 355 nm after Formation of Peeling Layer on Glass Wafer)

The peeling layer-forming compositions (4) to (10) that had good peeling properties were applied to a glass wafer by a spin coater, and heated on a hot plate at a temperature of 250° C. for 1 minute to form peeling layers (4) to (10), respectively. In order to determine the presence or absence of heat generation during laser irradiation, a thermo-label (trade name: Temp-plate, available from Wahl, corresponding to 76° C. to 260° C., the lowest detection temperature: 76° C.) was attached directly to the peeling layer. The laminated body was irradiated with a laser by a laser irradiation device (LSL-10 manufactured by Optopia Co., Ltd.) from a side of the glass wafer. The presence or absence of detection of heat generation by the thermo-label was confirmed. At that time, the output of the laser was in accordance with the conditions determined in Table 7.

In order to confirm the presence or absence of detection of heat generation after laser irradiation by a procedure other than the thermo-label, the temperature of the peeling layer was measured immediately after laser irradiation by an infrared thermometer (manufactured by Testo K.K.). The temperature of the peeling layer before the laser irradiation was about 27° C. The results are shown in Table 10.

TABLE 10

Confirmation and Verification 2 of Presence or Absence of Heat Generation by Irradiation with Laser of 355 nm

| | Thermo-label | Infrared thermometer |
|---|---|---|
| Peeling layer (4) | Heat generation was not detected | 28.1° C. |
| Peeling layer (5) | Heat generation was not detected | 27.6° C. |
| Peeling layer (6) | Heat generation was not detected | 27.6° C. |
| Peeling layer (7) | Heat generation was not detected | 26.8° C. |
| Peeling layer (8) | Heat generation was not detected | 27.3° C. |
| Peeling layer (9) | Heat generation was not detected | 27.3° C. |
| Peeling layer (10) | Heat generation was not detected | 26.5° C. |

The thermo-label was checked after laser irradiation. Heat generation was not detected, that was, an increase in temperature of the peeling layer was confirmed to be less than 76° C. The infrared thermometer was checked immediately after laser irradiation. In all the samples, an increase in temperature was not confirmed. Therefore, the absence of heat generation caused by irradiation with a laser of 355 nm was considered.

(Example 10) Evaluation of Debonding Using 12-Inch Wafer by Laser Irradiation

To a 301-mm glass wafer (EAGLE-XG, available from Corning Incorporated, thickness: 700 µm) as a wafer (support) on a carrier side, the peeling layer-forming composition (6) was applied by a spin coater (Delta 12RC, manufactured by SUSS MicroTec KK), and heated on a hot plate at a temperature of 250° C. for 1 minute to form a peeling layer (6). As a wafer having no construction for a wafer on a device side, a silicon wafer was used, and as a TEG wafer, a Cu pillar 300-mm wafer (thickness: 770 µm, chip size: 10 mm, Cu pillar diameter: 40 µm, Cu pillar height: 25 µm, bump pitch: 100 µm, substrate: SiN) manufactured by KIYOKAWA Plating Industry Co., Ltd., was used. To each of the wafers, the adhesive A was applied by a spin coater (XBS300 manufactured by SUSS MicroTec KK), and heated at 120° C. for 1 minute to form an adhesion layer A. The 301-mm glass wafer having the peeling layer (wafer on the carrier side) produced in advance was bonded to the wafer on the device side so that the peeling layer and the adhesion layer A were disposed between the wafers in a vacuum bonder (XBS300, manufactured by SUSS MicroTec KK). Thus, a laminated body was produced. Subsequently, the laminated body was heated on a hot plate at 200° C. for 10 minutes, to cure the adhesion layer A. The wafer on the device side of the obtained laminated body was made thin to 50 µm by a high rigid grinder (HRG300 manufactured by TOKYO SEIMITSU CO., LTD.). After then, the laminated body was subjected to a high temperature treatment in an oven at a temperature of 250° C. for 1 hour, and then mounted on a dicing tape (DU-300, available from Nitto Denko Corporation). The laminated body was irradiated with a laser having a wavelength of 308 nm by a laser irradiation device (Lambda SX manufactured by Coherent, Inc.) from a side of the glass wafer, and the optimal irradiation dose required for peeling was determined. The whole surface of the wafer was irradiated with a laser at the same irradiation dose, and the peeling properties of the glass wafer were confirmed. A case where easy peeling is possible is represented by "○," and a case where peeling is impossible is represented by "×." The results are shown in Table 11.

TABLE 11

Laser Debonding Test Using 12-inch Wafer

| | Kind of wafer on device side | Optimal irradiation dose [mJ/cm²] | Peeling Properties |
|---|---|---|---|
| Example (10-1) | Silicon wafer | 150 | ○ |
| Example (10-2) | Cu pillar wafer | 150 | ○ |
| Example (10-3) | Cu pillar wafer | 150 | ○ |
| Example (10-4) | Cu pillar wafer | 150 | ○ |

It was confirmed that the carrier wafer was easily peeled after laser irradiation. In a case of using the TEG wafer, it was also confirmed that the wafer was peeled with good reproducibility.

(Example 11) Verification of Tape Peeling (Tearing Adhesion Layer Off) after Debonding (Peeling) by Laser Irradiation To a 301-mm glass wafer (EAGLE-XG, available from Corning Incorporated, thickness: 700 µm) as a wafer (support) on a carrier side, the peeling layer-forming composition (6) was applied by a spin coater (Delta 12RC, manufactured by SUSS MicroTec KK), and heated on a hot plate at a temperature of 250° C. for 1 minute to form a peeling layer (6). As a wafer having no construction for a wafer on a device side, a silicon wafer was used, and as a TEG wafer, a Cu pillar 300-mm wafer (thickness: 770 µm, chip size: 10 mm, Cu pillar diameter: 40 µm, Cu pillar height: 25 µm, bump pitch: 100 µm, substrate: SiN) manufactured by KIYOKAWA Plating Industry Co., Ltd., was used. To each of the wafers, the adhesive A was applied by a spin coater (XBS300 manufactured by SUSS MicroTec KK), and heated at 120° C. for 1 minute to form an adhesion layer A. The 301-mm glass wafer having the peeling layer (wafer on the carrier side) produced in advance was bonded to the wafer on the device side so that the peeling layer and the adhesion layer A were disposed between the wafers in a vacuum bonder (XBS300, manufactured by SUSS MicroTec KK). Thus, a laminated body was produced. Subsequently, the laminated body was heated on a hot plate at 200° C. for 10 minutes, to cure the adhesion layer A. The wafer on the device side of the obtained laminated body was made thin to 50 µm by a high rigid grinder (HRG300 manufactured by TOKYO SEIMITSU CO., LTD.). After then, the laminated body was subjected to a high temperature treatment in an oven at a temperature of 250° C. for 1 hour, and then mounted on a dicing tape (DU-300, available from Nitto Denko Corporation). The whole surface of the wafer was irradiated with a laser having a wavelength of 308 nm by a laser irradiation device (Lambda SX manufactured by Coherent, Inc.) from a side of the glass wafer at an irradiation dose of 150 mJ/cm², and the glass wafer was peeled. A temporary adhesion layer formed by the adhesive A remained on the device side and the peeling layer were torn off through a tape peeling method using a peeling tape (DL0330MA available from Microcontrol electronic SRL) and a tape peeling device (DT300 manufactured by SUSS MicroTec KK) at a range of 60 to 180°, and the temporary adhesion layer was separated from the wafer on the device side. A case where no residue thereof remains on the wafer after separation by tape peeling is evaluated as "○," and a case where a residue thereof remains on the wafer after separation by tape peeling is evaluated as "×." The results are shown in Table 12.

TABLE 12

Verification of Tape Peeling

| | Kind of wafer on device side | Tape peeling properties |
|---|---|---|
| Example (11-1) | Silicon wafer | ○ |
| Example (11-2) | Cu pillar wafer | ○ |
| Example (11-3) | Cu pillar wafer | ○ |
| Example (11-4) | Cu pillar wafer | ○ |

(Example 12) Measurement of Transmittance of Peeling Layer

Each of the peeling layer-forming compositions was applied to a quartz substrate by a spin coater, and heated on a hot plate at 250° C. for 1 minute, at 250° C. for 5 minutes, at 300° C. for 2 minutes, at 350° C. for 2 minutes, or at 400° C. for 2 minutes, to form a peeling layer (film thickness: 0.2 µm). In order to judge whether the peeling layers could be used as a peeling layer for laser debonding, the transmittances of the peeling layers to light having a wavelength of 532 nm were measured by an ultraviolet-visible spectroscopy (UV2550 manufactured by Shimadzu Corporation). The results are shown in Table 13. Next, the transmittances to light having a wavelength of 532 nm are shown in Table 13.

TABLE 13

Measurement of Transmittance to Light Having Wavelength of 532 nm

| | Heating temperature [° C.] | Heating time [minute] | Transmittance [%] at 532 nm |
|---|---|---|---|
| Peeling layer (9) | 400 | 2 | 57.8 |
| Peeling layer (10) | 250 | 5 | 81.3 |
| | 300 | 2 | 71.3 |
| | 350 | 2 | 53.4 |
| | 400 | 2 | 56.9 |
| Comparative peeling layer (1) | 250 | 1 | 98.5 |

In the results of measurement of transmittance, the transmittances of the peeling layers (9) and (10) at low heating temperature are relatively high. As the heating temperature becomes higher, the transmittance becomes lower, which is a good result. The transmittance of the comparative peeling layer (1) is very high.

(Example 13) 532 nm Laser Irradiation Test, Confirmation of Optimal Irradiation Dose To a 100-mm glass wafer (EAGLE-XG, available from Corning Incorporated, thickness: 500 µm) as a wafer (support) on a carrier side, the peeling layer-forming compositions (9) and (10) and the comparative peeling layer-forming composition (1) were applied by a spin coater, and heated on a hot plate at 250° C. for 5 minutes, at 300° C. for 2 minutes, at 350° C. for 2 minutes, or at 400° C. for 2 minutes, to form peeling layers (9) and (10) and a comparative peeling layer (1), respectively.

To a 100-mm silicon wafer (thickness: 500 μm) as a wafer on a device side, the adhesive A was applied by a spin coater, and heated at 120° C. for 1 minute to form an adhesion layer A. The glass wafer having the laser peeling layer (wafer on the carrier side) produced in advance was bonded to the wafer on the device side so that the peeling layer and the adhesion layer A were disposed between the wafers in a vacuum bonder (manual bonder, manufactured by SUSS MicroTec KK). Thus, a laminated body was produced. Subsequently, the laminated body was heated on a hot plate at 200° C. for 10 minutes with the wafer on the device side disposed downwardly, to cure the adhesion layer A. The obtained laminated body was irradiated with a laser by a laser irradiation device (LT-2137 manufactured by Lotus-TII) from the glass wafer side. The optimal irradiation dose was set to the lowest dose causing peeling at an output range of 20 to 500 mJ/cm². The results are shown in Table 14.

TABLE 14

| 532 nm Laser Irradiation Test | | | |
|---|---|---|---|
| | Heating temperature [° C.] | Heating time [minute] | Optimal irradiation dose [mJ/cm²] |
| Peeling layer (9) | 400 | 2 | 300 |
| Peeling layer (10) | 250 | 5 | 500 |
| | 300 | 2 | 300 |
| | 350 | 2 | 200 |
| | 400 | 2 | 200 |
| Comparative peeling layer (1) | 250 | 1 | Not peeled (500 or more) |

It was confirmed that as the baking temperature was higher, the peeling layers (9) and (10) were peeled at low irradiation dose. When the baking temperature was low, high irradiation dose was required, but occurrence of peeling was confirmed. In the comparative peeling layer (1), peeling was not confirmed.

(Example 14) 532 nm Laser Debonding Test

To a 100-mm glass wafer (EAGLE-XG, available from Corning Incorporated, thickness: 500 μm) as a wafer (support) on a carrier side, the peeling layer-forming compositions (9) and (10) and the comparative peeling layer-forming composition (1) were applied by a spin coater, and heated on a hot plate under any one of conditions including at 250° C. for 5 minutes, at 300° C. for 2 minutes, at 350° C. for 2 minutes, and at 400° C. for 2 minutes, to form peeling layers (9) and (10) and a comparative peeling layer (1), respectively.

To a 100-mm silicon wafer (thickness: 500 μm) as a wafer on a device side, the adhesive A was applied by a spin coater, and heated at 120° C. for 1 minute to form an adhesion layer A. The glass wafer having the laser peeling layer (wafer on the carrier side) produced in advance was bonded to the wafer on the device side so that the peeling layer and the adhesion layer A were disposed between the wafers in a vacuum bonder (manual bonder, manufactured by SUSS MicroTec KK). Thus, a laminated body was produced. Subsequently, the laminated body was heated on a hot plate at 200° C. for 10 minutes with the wafer on the device side disposed downwardly, to cure the adhesion layer A. The whole surface of the wafer of the obtained laminated body was irradiated with a laser of 532 nm by a laser irradiation device (LT-2137 manufactured by Lotus-TII) from the glass wafer side. Thus, whether the glass wafer could be peeled was confirmed. At that time, the output of the laser was in accordance with the conditions determined in Table 14, and irradiation with the laser was carried out so that the leaser did not overlap in front-rear and left-right directions. A case where easy peeling is possible after laser irradiation is represented by "○," and a case where peeling is impossible after laser irradiation is represented by "×." The results are shown in Table 15.

TABLE 15

| 532 nm Laser Debonding Test | | | |
|---|---|---|---|
| | Heating temperature [° C.] | Heating time [minute] | Optimal irradiation dose [mJ/cm²] | Peeling Properties |
| Peeling layer (9) | 400 | 2 | 300 | ○ |
| Peeling layer (10) | 350 | 2 | 200 | ○ |
| | 400 | 2 | 200 | ○ |
| Comparative peeling layer (1) | 250 | 1 | 500 or more | X |

In the laminated bodies using the peeling layers (9) and (10), it was confirmed that the glass wafer (carrier side) was easily peeled after laser irradiation. On the other hand, in the laminated body using the comparative peeling layer (1), the glass wafer was not easily peeled.

(Example 15) (Confirmation of Heat Generation by Irradiation with Laser of 532 nm after Formation of Peeling Layer on Glass Wafer)

To a 100-mm glass wafer (EAGLE-XG, available from Corning Incorporated, thickness: 500 μm), the peeling layer-forming compositions (9) and (10) that had good peeling properties were applied by a spin coater, and heated on a hot plate at 250° C. for 5 minutes, at 300° C. for 2 minutes, at 350° C. for 2 minutes, or at 400° C. for 2 minutes, to form peeling layers (9) and (10), respectively. In order to confirm the presence or absence of heat generation during laser irradiation, the temperature of the peeling layer was measured immediately after laser irradiation by an infrared thermometer (manufactured by Testo K.K.). The laminated body was irradiated with a laser by a laser irradiation device (LT-2137 manufactured by Lotus-TII) from a side where the peeling layer was formed. The presence or absence of detection of heat generation was confirmed by the infrared thermometer. At that time, the output of the laser was in accordance with the conditions determined in Table 14. The temperature of the peeling layer before the laser irradiation was about 21° C. The results are shown in Table 16.

TABLE 16

Confirmation and Verification of Presence or Absence of
Heat Generation by Irradiation with Laser of 532 nm

| | Heating temperature [° C.] | Heating time [minute] | Optimal irradiation dose [mJ/cm$^2$] | Infrared thermometer [° C.] |
|---|---|---|---|---|
| Peeling layer (9) | 400 | 2 | 300 | 21.2° C. |
| Peeling layer (10) | 350 | 2 | 300 | 22.4° C. |
| | 350 | 2 | 200 | 20.3° C. |
| | 400 | 2 | 200 | 22.3° C. |
| Comparative peeling layer (1) | 250 | 1 | 500 or more | 20.6° C. |

The infrared thermometer was checked after irradiation with a laser of 532 nm. An increase in temperature was not found. Therefore, the absence of heat generation caused by laser irradiation was considered.

(Example 16) Verification of Tape Peeling (Tearing Adhesion Layer Off) after Debonding (Peeling) by Laser Irradiation To a 100-mm glass wafer (EAGLE-XG, available from Corning Incorporated, thickness: 500 μm) as a wafer (support) on a carrier side, the peeling layer-forming compositions (9) and (10) were applied by a spin coater, and heated on a hot plate at 250° C. for 5 minutes, at 300° C. for 2 minutes, at 350° C. for 2 minutes, or at 400° C. for 2 minutes, to form peeling layers (9) and (10), respectively. To a 100-mm silicon wafer (thickness: 500 μm) as a wafer on a device side, the adhesive A was applied by a spin coater, and heated at 120° C. for 1 minute to form an adhesion layer A. The glass wafer having the laser peeling layer (wafer on the carrier side) produced in advance was bonded to the wafer on the device side so that the peeling layer and the adhesion layer A were disposed between the wafers in a vacuum bonder (manual bonder, manufactured by SUSS MicroTec KK). Thus, a laminated body was produced. Subsequently, the laminated body was heated on a hot plate at 200° C. for 10 minutes with the wafer on the device side disposed downwardly, to cure the adhesion layer A. The whole surface of the wafer was irradiated with a laser having a wavelength of 532 nm by a laser irradiation device (LT-2137 manufactured by Lotus-TII) from a side of the glass wafer, and the glass wafer was peeled. A temporary adhesion layer formed by the adhesive A remained on the device side and the peeling layer were torn off using a peeling tape (N300 available from Nitto Denko Corporation), and the temporary adhesion layer was separated from the wafer on the device side. A case where no residue thereof remains on the wafer after separation by tape peeling is evaluated as "○," and a case where a residue thereof remains on the wafer after separation by tape peeling is evaluated as "x." The results are shown in Table 17.

TABLE 17

Verification of Tape Peeling

| | Heating temperature [° C.] | Heating time [minute] | Optimal irradiation dose [mJ/cm$^2$] | Tape peeling properties |
|---|---|---|---|---|
| Peeling layer (9) | 400 | 2 | 300 | ○ |
| Peeling layer (10) | 350 | 2 | 200 | ○ |
| | 400 | 2 | 200 | ○ |

(Example 17) Evaluation of Debonding Using 12-Inch Wafer by Laser Irradiation

To a 301-mm glass wafer (EAGLE-XG, available from Corning Incorporated, thickness: 700 μm) as a wafer (support) on a carrier side, the peeling layer-forming compositions (5), (6), (9), and (10) were applied by a spin coater (Delta 12RC, manufactured by SUSS MicroTec KK), and heated on a hot plate at 200° C. or 250° C. for 1 minute to form peeling layers (5), (6), (9), and (10). As a wafer on a device side, a silicon wafer was used. To each of the wafers, the adhesive A was applied by a spin coater (XBS300 manufactured by SUSS MicroTec KK), and heated at 120° C. for 1 minute to form an adhesion layer A. The 301-mm glass wafer having the peeling layer (wafer on the carrier side) produced in advance was bonded to the wafer on the device side so that the peeling layer and the adhesion layer A were disposed between the wafers in a vacuum bonder (XBS300, manufactured by SUSS MicroTec KK). Thus, a laminated body was produced. Subsequently, the laminated body was heated on a hot plate at 170° C. for 7 minutes and then at 190° C. for 7 minutes, to cure the adhesion layer A. The wafer on the device side of the obtained laminated body was made thin to 50 μm by a high rigid grinder (HRG300 manufactured by TOKYO SEIMITSU CO., LTD.). After then, the laminated body was subjected to a high temperature treatment in an oven at a temperature of 200° C. for 1 hour, and then mounted on a dicing tape (DU-300, available from Nitto Denko Corporation). The laminated body was irradiated with a laser having a wavelength of 308 nm by a laser irradiation device (ELD300 manufactured by SUSS MicroTec KK) from a side of the glass wafer, and the optimal irradiation dose required for peeling was determined. The whole surface of the wafer was irradiated with a laser at the same irradiation dose, and the peeling properties of the glass wafer were confirmed. A case where easy peeling is possible without damaging the wafer is represented by "○," and a case where peeling is impossible without damaging the wafer is represented by "x." The results are shown in Table 18.

TABLE 18

Laser Debonding Test Using 12-inch Wafer

| | Heating temperature of peeling layer [° C.] | Optimal irradiation dose [mJ/cm$^2$] | Peeling Properties |
|---|---|---|---|
| Peeling layer (5) | 200 | 200 | ○ |
| Peeling layer (6) | 250 | 190 | ○ |
| Peeling layer (9) | 200 | 180 | ○ |
| Peeling layer (10) | 250 | 170 | ○ |

It was confirmed that the carrier wafer was easily peeled after laser irradiation.

(Example 18) Verification of Tape Peeling (Tearing Adhesion Layer Off) after Debonding (Peeling) by Laser Irradiation A temporary adhesion layer formed by the adhesive A remained on the thin wafer produced in Example (17) and the peeling layer were torn off through a tape peeling method using a tape (N-300 available from Nitto Denko Corporation) and a tape peeling device (DT300 manufactured by SUSS MicroTec KK) at 60°, and the temporary adhesion layer was separated from the wafer on the device side. A case where no residue thereof remains on the wafer after separation by tape peeling is evaluated as "○," and a case where a residue thereof remains on the wafer after separation by tape peeling is evaluated as "×." A case where the wafer is not damaged is represented to be good as "○," and a case where cracking or the like is confirmed is represented to be poor as "×." The results are shown in Table 19.

TABLE 19

Verification of Tape Peeling

| | Peeling properties | Damage of wafer |
|---|---|---|
| Peeling layer (5) | ○ | ○ |
| Peeling layer (6) | ○ | ○ |
| Peeling layer (9) | ○ | ○ |
| Peeling layer (10) | ○ | ○ |

In all the samples, it was confirmed that tape peeling was achieved without a residue and without to damage of a wafer.

INDUSTRIAL APPLICABILITY

The present invention provides a laminated body for separating an object to be processed by cutting or the like, or for processing, for example, polishing a back surface of a wafer, the laminated body comprising an intermediate layer that is disposed between a support and the object to be processed and peelably adheres to the support and the object to be processed, wherein the intermediate layer includes at least a peeling layer in contact with the support, and the peeling layer contains a novolac resin that absorbs light with a wavelength of 190 nm to 400 nm or 190 nm to 600 nm incident through the support, resulting in modification, and a material and a method for separation without mechanical load.

The invention claimed is:

1. A laminated body for processing an object to be processed, the laminated body comprising an intermediate layer that is disposed between a support and the object to be processed and peelably adheres to the support and the object to be processed, wherein the intermediate layer includes at least a peeling layer in contact with the support, and the peeling layer contains a novolac resin that absorbs light with a wavelength of 190 nm to 600 nm incident through the support, resulting in modification; wherein
the peeling layer contains a polymer (C) having the following unit structure (C1-1), (C1-2), or (C1-3), or a combination thereof

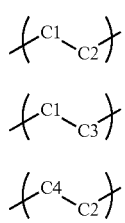

Formula (C1-1)

Formula (C1-2)

Formula (C1-3)

where (C1) is a group derived from an aromatic compound having a nitrogen atom, (C2) is a group forming a secondary carbon atom, a quaternary carbon atom, or a tertiary carbon atom having an aromatic ring in a side chain, (C3) is a group derived from an aliphatic polycyclic compound, and (C4) is a group derived from phenol, bisphenol, naphthol, biphenyl, biphenol, or a combination thereof.

2. A laminated body for cutting a plurality of chips with a redistribution layer that are fixed by a resin after peeling a support into a small number of chips, the laminated body comprising an intermediate layer that is disposed between the support and the redistribution layer having the chips fixed by the resin and peelably adheres to the support and the redistribution layer, wherein the intermediate layer includes at least a peeling layer in contact with the support, and the peeling layer contains a novolac resin that absorbs light with a wavelength of 190 nm to 600 nm incident through the support, resulting in modification; wherein
the peeling layer contains a polymer (C) having the following unit structure (C1-1), (C1-2), or (C1-3), or a combination thereof

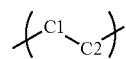

Formula (C1-1)

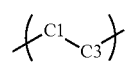

Formula (C1-2)

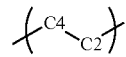

Formula (C1-3)

where (C1) is a group derived from an aromatic compound having a nitrogen atom, (C2) is a group forming a secondary carbon atom, a quaternary carbon atom, or a tertiary carbon atom having an aromatic ring in a side chain, (C3) is a group derived from an aliphatic polycyclic compound, and (C4) is a group derived from phenol, bisphenol, naphthol, biphenyl, biphenol, or a combination thereof.

3. A laminated body for polishing a back surface of a wafer, comprising an intermediate layer that is disposed between a support and a circuit surface of the wafer and peelably adheres to the support and the circuit surface, wherein the intermediate layer includes an adhesion layer in contact with the wafer and a peeling layer in contact with the support, and the peeling layer contains a novolac resin that absorbs light with a wavelength of 190 nm to 600 nm incident through the support, resulting in modification; wherein the intermediate layer includes the adhesion layer containing a component (A) to be cured by a hydrosilylation reaction and a component (B) containing a polydimethylsiloxane.

4. The laminated body according to claim 1, wherein a light transmittance of the peeling layer at a wavelength range of 190 nm to 600 nm is 1 to 90%.

5. The laminated body according to claim 1, wherein the modification caused by absorption of light having the wavelength is photodecomposition of the novolac resin.

6. The laminated body according to claim 3, wherein the component (A) contains a polysiloxane selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, and a siloxane unit (T unit) of $R^6SiO_{3/2}$ (provided that $R^1$ to $R^6$ each are bonded to a silicon atom through an Si—C bond or an Si—H bond), and contains a polysiloxane (A1) containing a polyorganosiloxane (a1) in which monovalent chemical groups of $R^1$ to $R^6$ each contain a $C_{1-10}$ alkyl group and a $C_{2-10}$ alkenyl group, and a polyorganosiloxane (a2) in which the monovalent chemical groups of $R^1$ to $R^6$ each contain a $C_{1-10}$ alkyl group and a hydrogen atom, and a platinum group metal-based catalyst (A2).

7. The laminated body according to claim 3, wherein the component (A) further contains an inhibitor (A3).

8. A laminated body for polishing a back surface of a wafer, comprising an intermediate layer that is disposed between a support and a circuit surface of the wafer and peelably adheres to the support and the circuit surface, wherein the intermediate layer includes an adhesion layer in contact with the wafer and a peeling layer in contact with the support, and the peeling layer contains a novolac resin that absorbs light with a wavelength of 190 nm to 600 nm incident through the support, resulting in modification; wherein
the intermediate layer includes the adhesion layer containing a component (A) to be cured by a hydrosilylation reaction and a component (B) containing a polydimethylsiloxane, and
the component (B) is a polydimethylsiloxane having a viscosity of 1,000 mm²/s to 2,000,000 mm²/s.

9. A laminated body for polishing a back surface of a wafer, comprising an intermediate layer that is disposed between a support and a circuit surface of the wafer and peelably adheres to the support and the circuit surface, wherein the intermediate layer includes an adhesion layer in contact with the wafer and a peeling layer in contact with the support, and the peeling layer contains a novolac resin that absorbs light with a wavelength of 190 nm to 600 nm incident through the support, resulting in modification; wherein
the intermediate layer includes the adhesion layer containing a component (A) to be cured by a hydrosilylation reaction and a component (B) containing a polydimethylsiloxane, and
the component (B) is a polydimethylsiloxane having a viscosity of 10,000 mm²/s to 1,000,000 mm²/s.

10. The laminated body according to claim 3, wherein a ratio in % by mass of the component (A) to the component (B) in an adhesive is 80:20 to 50:50.

11. A laminated body for polishing a back surface of a wafer, comprising an intermediate layer that is disposed between a support and a circuit surface of the wafer and peelably adheres to the support and the circuit surface, wherein the intermediate layer includes an adhesion layer in contact with the wafer and a peeling layer in contact with the support, and the peeling layer contains a novolac resin that absorbs light with a wavelength of 190 nm to 600 nm incident through the support, resulting in modification; wherein the peeling layer contains a polymer (C) having the following unit structure (C1-1), (C1-2), or (C1-3), or a combination thereof

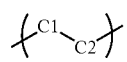
Formula (C1-1)

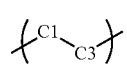
Formula (C1-2)

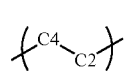
Formula (C1-3)

(where (C1) is a group derived from an aromatic compound having a nitrogen atom, (C2) is a group forming a secondary carbon atom, a quaternary carbon atom, or a tertiary carbon atom having an aromatic ring in a side chain, (C3) is a group derived from an aliphatic polycyclic compound, and (C4) is a group derived from phenol, bisphenol, naphthol, biphenyl, biphenol, or a combination thereof).

12. The laminated body according to claim 1, wherein the group (C1) derived from an aromatic compound having a nitrogen atom is a group derived from carbazole or phenylnaphthylamine.

13. A laminated body for processing an object to be processed, the laminated body comprising an intermediate layer that is disposed between a support and the object to be processed and peelably adheres to the support and the object to be processed, wherein the intermediate layer includes at least a peeling layer in contact with the support, and the peeling layer contains a novolac resin that absorbs light with a wavelength of 190 nm to 600 nm incident through the support, resulting in modification; wherein
the peeling layer contains a polymer (C) having the following unit structure (C1-1), (C1-2), or (C1-3), or a combination thereof

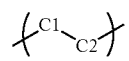
Formula (C1-1)

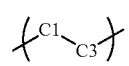
Formula (C1-2)

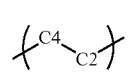
Formula (C1-3)

where
(C1) is a group derived from an aromatic compound having a nitrogen atom,
(C2) is a group forming a secondary carbon atom, a quaternary carbon atom, or a tertiary carbon atom having an aromatic ring in a side chain, the group (C2) being a group derived from 1-naphthaldehyde, 1-pyrenecarboxyaldehyde, or 4-(trifluoromethyl)benzaldehyde,
(C3) is a group derived from dicyclopentadiene, and
(C4) is a group derived from phenol, bisphenol, naphthol, biphenyl, biphenol, or a combination thereof.

14. A method for producing the laminated body according to claim 3 comprising steps of:
applying an adhesive for forming the adhesion layer containing a component (A) to be cured by a hydrosilylation reaction and a component (B) containing a polydimethylsiloxane to the circuit surface of the wafer to form the adhesion layer;
applying a peeling layer-forming composition for forming the peeling layer containing a polymer (C) having the following unit structure (C1-1), (C1-2), or (C1-3), or a combination thereof

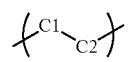
Formula (C1-1)

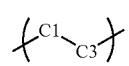
Formula (C1-2)

Formula (C1-3)

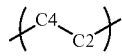

(wherein (C1) is a group derived from an aromatic compound having a nitrogen atom, (C2) is a group forming a secondary carbon atom, a quaternary carbon atom, or a tertiary carbon atom having an aromatic ring in a side chain, (C3) is a group derived from an aliphatic polycyclic compound, and (C4) is a group derived from phenol, bisphenol, naphthol, biphenyl, biphenol, or a combination thereof) to the support to form the peeling layer; and bonding the wafer and the support so that the adhesion layer is in contact with the peeling layer followed by heating at 120° C. to 300° C. to achieve joining.

15. The method for producing the laminated body according to claim 14, wherein the bonding is carried out under a reduced pressure of 10 Pa to 10,000 Pa.

16. A method for peeling the support and the object to be processed according to claim 1, wherein the support is a glass substrate, and irradiation with light with a wavelength of 190 nm to 400 nm is carried out from a side of the support.

17. A removing method, wherein the object to be processed according to claim 16 is a wafer, and the adhesion layer or the peeling layer is removed from the support or the wafer using a tape after peeling the support and the wafer.

* * * * *